(12) United States Patent
Tsou et al.

(10) Patent No.: US 12,062,713 B2
(45) Date of Patent: Aug. 13, 2024

(54) MEMORY DEVICE AND FORMING METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Ya-Jui Tsou, Taichung (TW); Wei-Jen Chen, Tainan (TW); Pang-Chun Liu, Taoyuan (TW); Chee-Wee Liu, Taipei (TW); Shao-Yu Lin, Taichung (TW); Chih-Lin Wang, Hsinchu County (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 17/715,886

(22) Filed: Apr. 7, 2022

(65) Prior Publication Data

US 2023/0170403 A1    Jun. 1, 2023

Related U.S. Application Data

(60) Provisional application No. 63/283,353, filed on Nov. 26, 2021.

(51) Int. Cl.
*H01L 29/66* (2006.01)
(52) U.S. Cl.
CPC .............................. *H01L 29/66984* (2013.01)

(58) Field of Classification Search
None
See application file for complete search history.

(56) References Cited

U.S. PATENT DOCUMENTS

| | | | |
|---|---|---|---|
| 8,785,966 B2 | 7/2014 | Worledge et al. | |
| 11,430,832 B2 | 8/2022 | Lin et al. | |
| 2005/0036379 A1* | 2/2005 | Kim | B82Y 10/00 257/E27.005 |
| 2006/0034117 A1* | 2/2006 | Jeong | G11C 11/16 365/158 |

(Continued)

FOREIGN PATENT DOCUMENTS

| | | | |
|---|---|---|---|
| CN | 101777569 A | * | 7/2010 |
| TW | 202123500 A | | 6/2021 |

OTHER PUBLICATIONS

17715886_2023-07-27_CN_101777569_A_M.pdf, English translation of CN 101777569 A (Year: 2010).*

(Continued)

*Primary Examiner* — Khaja Ahmad
(74) *Attorney, Agent, or Firm* — Maschoff Brennan

(57) ABSTRACT

A memory device comprises a source region, a drain region, a channel region, a gate dielectric layer, an MTJ stack, and a metal gate. The source region and the drain region are over a substrate. The channel region is between the source region and the drain region. The gate dielectric layer is over the channel region. The MTJ stack is over the gate dielectric layer. The MTJ stack comprises a first ferromagnetic layer, a second ferromagnetic layer with a switchable magnetization, and a tunnel barrier layer between the first and second ferromagnetic layers. The metal gate is over the MTJ stack.

20 Claims, 35 Drawing Sheets

(56) References Cited

U.S. PATENT DOCUMENTS

| | | | |
|---|---|---|---|
| 2008/0239796 A1* | 10/2008 | Aoki | H10B 61/22 365/158 |
| 2009/0057654 A1 | 3/2009 | Saito et al. | |
| 2010/0208515 A1* | 8/2010 | Aoki | B82Y 25/00 365/171 |
| 2014/0097474 A1 | 4/2014 | Saito et al. | |
| 2014/0231888 A1 | 8/2014 | Kelber et al. | |
| 2017/0018704 A1* | 1/2017 | Chuang | H10B 61/22 |
| 2018/0337266 A1* | 11/2018 | Ohtou | H01L 29/7855 |
| 2020/0075670 A1* | 3/2020 | Lin | H10N 50/10 |

OTHER PUBLICATIONS

A. Agrawal et al., "Gate-All-Around Strained Si0.4Ge0.6 Nanosheet PMOS on Strain Relaxed Buffer for High Performance Low Power Logic Application", IEEE International Electron Devices Meeting (IEDM), Dec. 12, 2020.

Cheng-Ming Lin et al., "Interfacial layer-free ZrO2 on Ge with 0.39-nm EOT, κ~43, ~2x10-3 A/cm2 gate leakage, SS=85 mV/dec, Ion/Ioff =6x105, and high strain response", IEEE International Electron Devices Meeting (IEDM), Dec. 10, 2012.

Hideo Kaiju et al., "Robustness of Voltage-induced Magnetocapacitance", Scientific Reports vol. 8, Article No. 14709, Oct. 2, 2018.

P. Padhan et al., "Frequency-dependent magnetoresistance and magnetocapacitance properties of magnetic tunnel junctions with MgO tunnel barrier", Appl. Phys. Lett. 90, 142105, Apr. 4, 2007.

Y. C. Wu et al., "Deterministic and field-free voltage-controlled MRAM for high performance and low power applications", IEEE Symposium on VLSI Technology 2000, Jun. 16, 2020.

T. Endoh et al., "STT and SOT MRAM technologies and its applications from IoT to AI System", IEDM 2020 Tutorial Tohoku Univ., Dec. 5, 2020.

Wang Kang et al., "Modeling and Exploration of the Voltage-Controlled Magnetic Anisotropy Effect for the Next-Generation Low-Power and High-Speed MRAM Applications", IEEE Transactions on Nanotechnology vol. 16, No. 3, May 2017.

\* cited by examiner

| | Column1 | Column2 | Column3 | Column4 | Column5 | Column6 |
|---|---|---|---|---|---|---|
| Condition (C unit: fF/um²) | MTJ State | $C_{MTJ}$ fF/um² | $C_{total}$ fF/um² | $V_{TH, AP} - V_{TH, P}$ | $I_{dsat, P}/I_{dsat, AP}$ Ratio | $I_{sub, P}/I_{sub, AP}$ Ratio |
| Row1: $C_{MTJ, AP}$ = 116-118 (TMC = 90-100%) $C_{ox}$ = 38-39 (EOT = 0.85-0.95 nm) | P | 234-238 | 31-35 | 0.033-0.035 V | 1.39-1.43 | 3.1-3.5 |
| | AP | 116-118 | 28-29 | | | |
| Row2: $C_{MTJ, AP}$ = 116-118 (TMC = 90-100%) $C_{ox}$ = 88-89 (EOT = 0.37-0.41 nm) | P | 234-238 | 64-66 | 0.033-0.035 V | 1.56-1.60 | 3.1-3.5 |
| | AP | 116-118 | 50-52 | | | |
| Row3: $C_{MTJ, AP}$ = 38-40 (TMC = 90-100%) $C_{ox}$ = 88-89 (EOT = 0.37-0.41 nm) | P | 78-80 | 40-42 | 0.101-0.103 V | 2.73-2.77 | 34-38 |
| | AP | 38-40 | 26-28 | | | |
| Row4: $C_{MTJ, AP}$ = 38-40 (TMC = 180-200%) $C_{ox}$ = 88-89 (EOT = 0.37-0.41 nm) | P | 116-118 | 50-52 | 0.135-0.137 V | 3.91-3.95 | 116-120 |
| | AP | 38-40 | 26-28 | | | |

Fig. 5

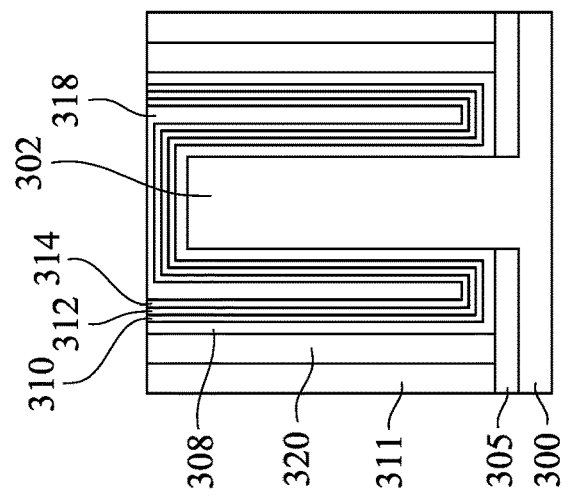
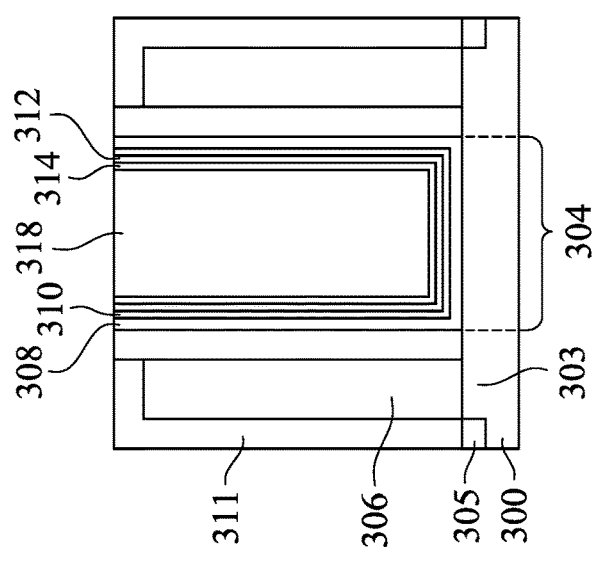
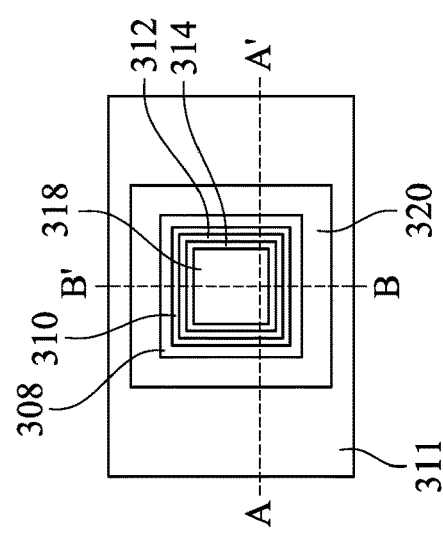
Fig. 29C
Fig. 29B
Fig. 29A

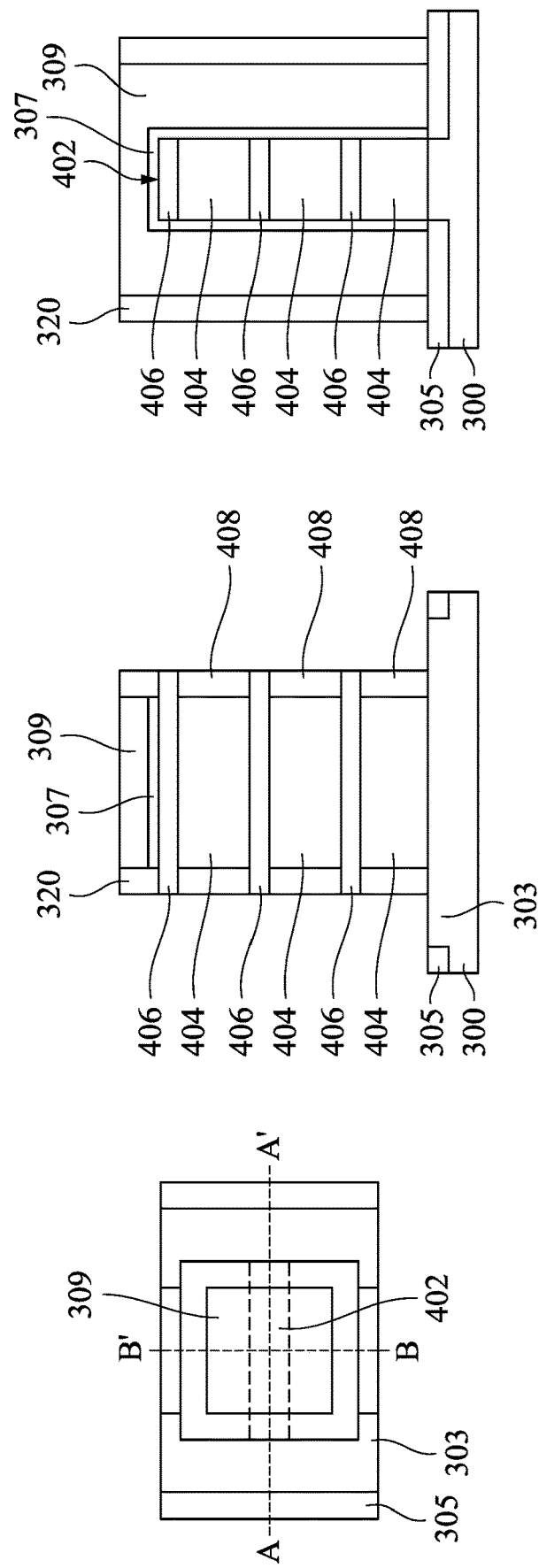

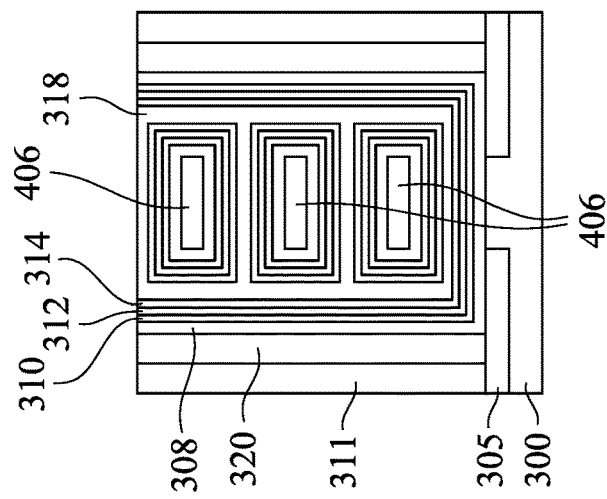
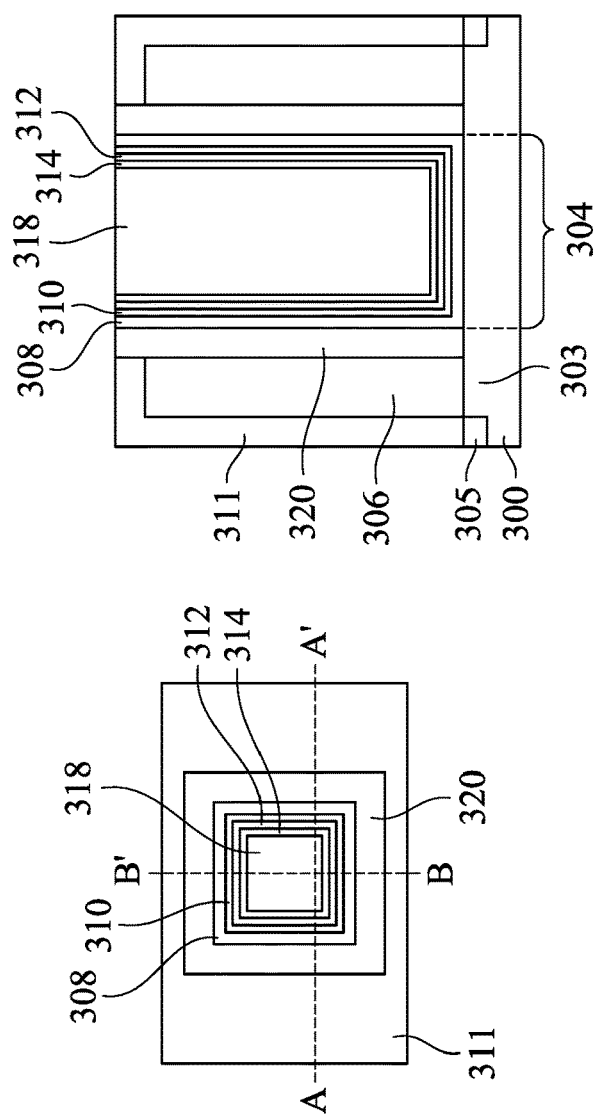
Fig. 35C
Fig. 35B
Fig. 35A

MEMORY DEVICE AND FORMING METHOD THEREOF

PRIORITY CLAIM AND CROSS-REFERENCE

This application claims the benefit of U.S. Provisional Application No. 63/283,353, filed on Nov. 26, 2021, which application is hereby incorporated herein by reference in its entirety.

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Magnetic tunnel junctions (MTJs) can be used in hard disk drives and/or RAM, and thus are promising candidates for next generation memory solutions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a chart providing example simulation results of read operations of various MeFET-based memory devices in saturation regions and subthreshold regions, in accordance with some embodiments of the present disclosure.

FIGS. 26A-29C are top views and cross-sectional views of intermediate stages in the manufacturing of an IC structure having MeFET memory devices using a gate-last process flow, in accordance with some embodiments of the present disclosure.

FIGS. 30A-35C are top views and cross-sectional views of intermediate stages in the manufacturing of an IC structure having MeFET memory devices in a form of gate-all-around (GAA) devices, in accordance with some embodiments of the present disclosure.

DETAILED DESCRIPTION

Figure 1:
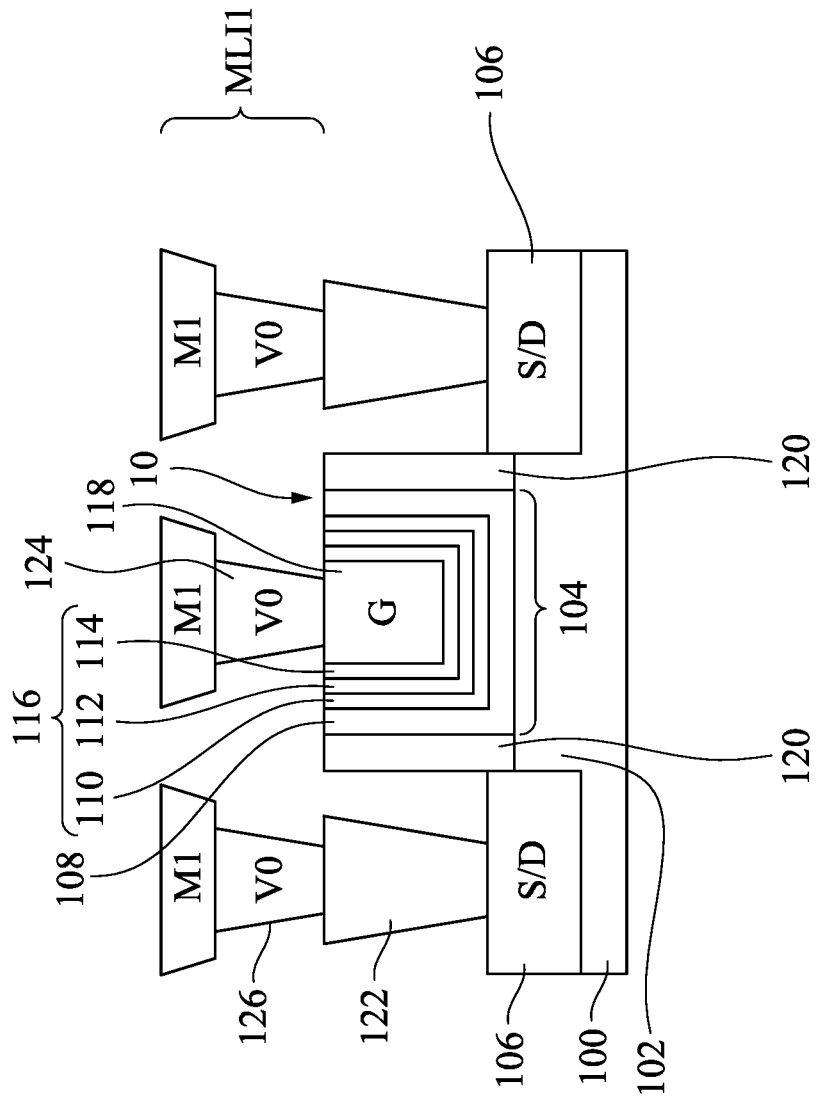
FIG. 1 is cross-sectional view of an example IC structure comprising an MeFET-based memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-resistive random-access memory (MRAM) cell generally comprises a magnetic tunnel junction (MTJ) cell vertically arranged within an integrated chip back-end-of-the-line (BEOL) between conductive electrodes. An MTJ cell includes first and second ferromagnetic layers separated by a tunnel barrier layer. One of the ferromagnetic layers (often referred to as a "reference layer" or "pinned layer") has a fixed magnetization direction (also called magnetization orientation), while the other ferromagnetic layer (often referred to as a "free layer") has a variable or switchable magnetization direction. For MTJ cells with positive tunnel magnetoresistance (TMR), if the magnetization directions of the reference layer and free layer are in a parallel orientation, it is more likely that electrons will tunnel through the tunnel barrier layer, such that the MTJ cell is in a low-resistance state. Conversely, if the magnetization directions of the reference layer and free layer are in an anti-parallel orientation, it is less likely that electrons will tunnel through the tunnel barrier layer, such that the MTJ cell is in a high-resistance state. Consequently, the MTJ cell can be generally switched using TMR between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). Because of their binary nature, MTJ cells can be used to store digital data, with the low resistance state $R_P$ corresponding to a first data state (e.g., logical "0"), and the high-resistance state $R_{AP}$ corresponding to a second data state (e.g., logical "1").

In a spin-transfer torque ("STT") MRAM ("STT-MRAM") cell, the write current is applied passing through the entire MTJ, i.e., reference layer, the tunnel barrier layer, and the free layer, which sets the magnetization direction of the free layer through the spin-transfer torque effect. Therefore, the STT-MRAM cell usually suffers tunnel barrier reliability degradation because both write current and read current pass through the thin tunnel barrier layer. In a spin-orbit torque ("SOT") MRAM ("SOT-MRAM") cell, a MTJ structure is positioned on a heavy metal layer with large spin-orbit interaction. Spin torque is induced by the in-plane current injected through the heavy metal layer under the spin-orbit coupling effect, which generally includes one or more of the Rashba effect or the spin Hall effect ("SHE effect"). The write current does not pass through the vertical MTJ. Instead, the write current passes through the heavy metal layer in an in-plane direction. The magnetization direction in the free layer is set through the SOT effect. More specifically, when a current is injected in-plane in the heavy metal layer, the spin orbit coupling leads to an orthogonal spin current which creates a spin torque and induce magnetization reversal in the free layer. The SOT-MRAM cell usually requires a large write current to induce the magnetization reversal in the free layer, which in turn increases the MRAM cell size and power consumption.

The present disclosure, in some embodiments, provides a magneto-electric field effect transistor (MeFET) having an MTJ within a gate structure of the MeFET. The magnetization state of the MTJ can be switched between an anti-parallel state (AP state) and a parallel state (P state) by using voltage-controlled magnetic anisotropy (VCMA). With tunnel magnetocapacitance (TMC) effect of MTJ, the MTJ has a lower capacitance in AP state than in P state, and thus the MTJ can be switched between two states of capacitance, i.e., a first state with a with a low capacitance ($C_{MTJ, AP}$: magnetization directions of reference layer and free layer are anti-parallel) and a second state with a high capacitance ($C_{MTJ, P}$: magnetization directions of reference layer and free layer are parallel). The MTJ capacitance difference causes a gate capacitance difference between the AP state and the P state, which in turn leads to a difference in threshold voltage of the MeFET between the AP state and the P state, which in turn leads to difference in saturation current and/or subthreshold current of the MeFET between the AP state and the P state. Because of binary nature of the MTJ capacitance, the MeFET can serve as a memory device to store digital data, with the low MTJ capacitance state $C_{MTJ, AP}$ corresponding to a first data state (e.g., logical "0"), and the high MTJ capacitance state $C_{MTJ, P}$ corresponding to a second data state (e.g., logical "1"). The MeFET-based memory device can be operated using VCMA or a magnetic field without passing a current through the tunnel barrier layer in the MTJ, and thus the MeFET-based memory device has an improve tunnel barrier reliability and a reduced power consumption as compared to the MRAM devices discussed above.

FIG. 1 is cross-sectional view of an example integrated circuit (IC) structure comprising a substrate 100 in which one or more MeFET-based memory devices 10 are formed, a portion of a multilevel interconnect structure (e.g., metal vias V0 and metal lines M1) formed over the substrate, in accordance with some embodiments of the present disclosure. Generally, FIG. 1 illustrates an MeFET-based memory device 10 in a form of a fin-type field effect transistor (FinFET) that includes a semiconductor fin 102 extending from the substrate 100, an MTJ-containing gate structure (or called MTJ-containing gate stack) 104 extending across the semiconductor fin 102, source and drain regions 106 on opposite sides of the MTJ-containing gate structure 104. In some embodiments, the MeFET-based memory device may be in a form of a gate-all-around (GAA) FET, planar FET, complementary FET (CFET), or the like.

The substrate 100 illustrated in FIG. 1 may be a semiconductor substrate, such as a bulk semiconductor substrate, a semiconductor-on-insulator (SOI) substrate, a multi-layered or gradient substrate, or the like. The substrate 100 may include a semiconductor material, such as an elemental semiconductor including Si and Ge; a compound or alloy semiconductor including SiC, SiGe, GeSn, GaAs, GaP, GaAsP, AlInAs, AlGaAs, GaInAs, InAs, GaInP, InP, InSb, GaInAsP; a combination thereof, or the like. The substrate 200 may be doped or substantially un-doped. In a specific example, the substrate 200 is a bulk silicon substrate, which may be a wafer.

The MeFET-based memory device 10 illustrated in FIG. 1 is a three-dimensional MOSFET structure formed in a fin-like strip of semiconductor protrusion 102 referred to as a fin. The cross-section shown in FIG. 1 is taken along a longitudinal axis of the semiconductor fin 102 in a direction parallel to the direction of the current flow between the source and drain regions 106 (collectively referred to as source/drain regions or S/D regions 106). The fin 102 may be formed by patterning the substrate using photolithography and etching technique. The fin 102 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 102 by etching a trench into the substrate 100 using, for example, reactive ion etching (RIE). FIG. 1 illustrates a single fin 102, although the substrate 100 may comprise any number of fins.

The MTJ-containing gate structure 104 may have a longitudinal axis perpendicular to the longitudinal axis of the semiconductor fin 102. The MTJ-containing gate structure 104 thus wraps around the semiconductor fin 102 on three sides. The MTJ-containing gate structure 104 includes a gate dielectric layer 108, a hard magnetic layer 110 over the gate dielectric layer 108, a tunnel barrier layer 112 over the hard magnetic layer 110, a soft magnetic layer 114 over the tunnel barrier layer 112, and a metal gate 118 over the soft magnetic layer 114. The hard magnetic layer 110, the tunnel barrier layer 112, and the soft magnetic layer 114 collectively serve as an MTJ stack 116. The soft magnetic layer 114 and the hard magnetic layer 110 are each capable of holding a magnetization direction. The magnetization direction of the soft layer 114 can be switched or altered by VCMA or exposure to magnetic fields generated within the memory device 10 during operations. However, the magnetization direction of the hard layer 110 cannot be switched or altered after manufacturing. The hard layer 110 therefore includes a ferromagnetic reference layer or pinned layer while the soft layer 114 includes a ferromagnetic free layer. In some embodiments, the tunnel barrier layer 112 has a greater thickness than the hard layer 110 and/or the soft layer 114. For example, the tunnel barrier layer 112 has a thickness in a range from about 0.5 nm to about 50 nm, the soft layer 114 has a thickness in a range from about 0.5 nm to about 10 nm, and the hard layer 110 has a thickness in a range from about 0.5 nm to about 30 nm. In some embodiments, the total thickness of the MTJ stack 116 is in a range from about 22 nm to about 36 nm.

Figure 2:
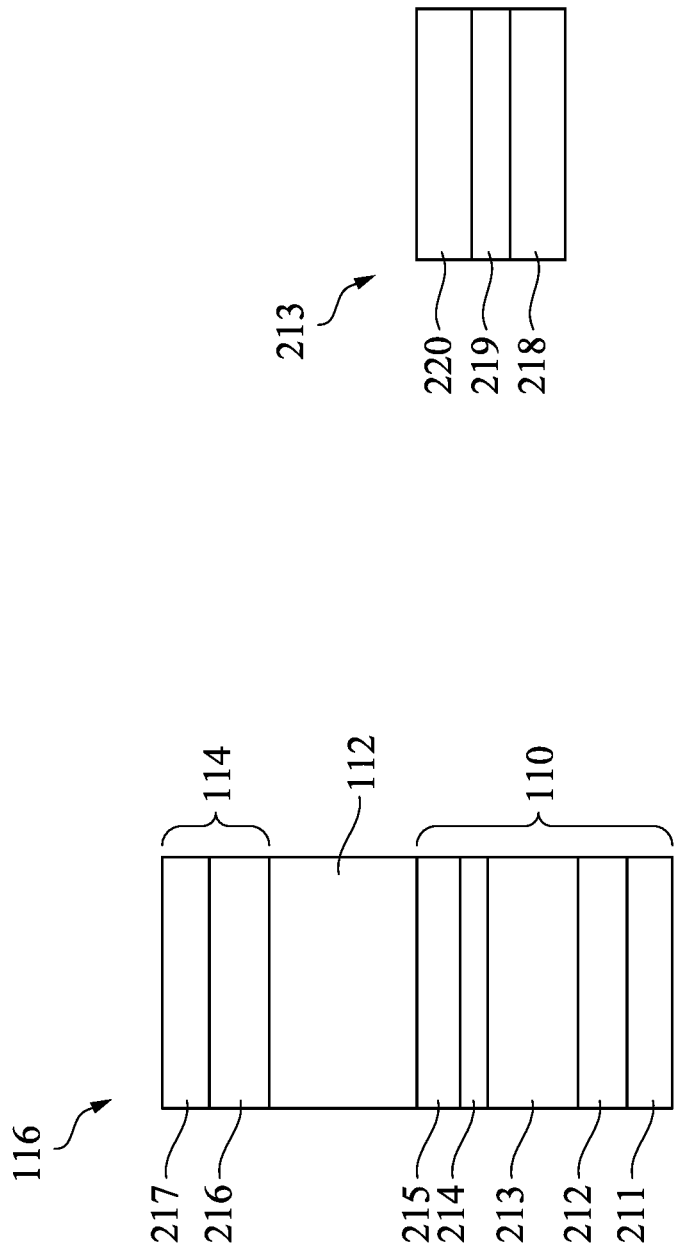
FIG. 2A is a cross-sectional view illustrating a film stack of an MTJ stack in the MeFET-based memory device in accordance with some embodiments of the present disclosure.
FIG. 2B is a cross-sectional view illustrating a film stack of a SAF layer in the MTJ stack in accordance with some embodiments of the present disclosure.

FIG. 2A is a cross-sectional view illustrating a film stack of an MTJ stack 116 in accordance with some embodiments of the present disclosure. The MTJ stack 116 includes a bottom electrode 211 over the gate dielectric layer 108. In some embodiments, the bottom electrode 211 includes Ta, TaN, TiN, W, Ru, the like, and/or alloys thereof. The bottom electrode 211 has a thickness in a range from about 1 nm to about 50 nm. In some embodiments, the bottom electrode 211 is a dummy electrode because it is not electrically coupled to the overlying metal gate 118 and the underlying fin 102. The MTJ stack 116 further includes a seed layer 212 over the bottom electrode 211. The seed layer 212 includes Pt, Ta, Ru, the like, and/or alloys thereof, and has a thickness in a range from about 1 nm to about 50 nm.

The MTJ stack 116 further includes a pinned layer 213 formed over the seed layer 212. In some embodiments, the pinned layer 213 is a synthetic antiferromagnetic (SAF) layer. The SAF layer 213 can serve to pin the magnetization direction of the reference layer 215 in a fixed direction. Pinning the magnetization direction of the reference layer 215 allows the MTJ stack 116 to be toggled between a low-capacitance state and a high-capacitance state by changing the magnetization direction of the free layer 216 relative to the reference layer 215.

The SAF layer 213 may include multiple layers of different materials, in some embodiments. For example, the SAF layer 213 may comprise a stack of one or more ferromagnetic layers and one or more non-magnetic layers. For example, as illustrated in FIG. 2B, the SAF layer 213 may include two ferromagnetic layers 218 and 220, with a non-magnetic spacer layer 219 sandwiched between the ferromagnetic layers 218 and 220, or may be a stack of alternating non-magnetic layers and ferromagnetic layers. In some embodiments, the ferromagnetic layers 218 and 220 may be formed of a material such as Co, Pt, Fe, Ni, CoFe, NiFe, CoFeB, CoFeBW, alloys thereof, the like, or combinations thereof. For example, the ferromagnetic layers 218 and 220 each are a multilayer structure made of (Co/Pt)n, (Co/Ni)n or the like where n is the number of laminates (e.g., n ranges from about 1-20), and a total thickness of the multilayer structure is in a range from about 0.1 nm to about 100 nm. In some embodiments, the non-magnetic spacer layer 219 may be formed of material such as Ru, Ir, W, Ta, Mg, the like, or combinations thereof, and include a thickness in a range from about 0.1 nm to about 5 nm. In some embodiments, a thicker SAF layer 213 may have stronger antiferromagnetic properties, or may be more robust against external magnetic fields or thermal fluctuation.

The MTJ stack 116 further includes a metal spacer layer 214 formed over the pinned layer 213. In some embodiments, the metal spacer layer 214 may be formed of material such as Ta, W, Mo, the like, or combinations thereof, and include a thickness in a range from about 0.1 nm to about 5 nm. The MTJ stack 116 includes a reference layer 215 formed over the metal spacer layer 214. The reference layer 215 may be a ferromagnetic layer formed of a ferromagnetic material, such as one or more layers of Fe, Co, CoFe, NiFe, CoFeB, CoFeBW, alloys thereof, the like, or combinations thereof. The reference layer 215 has a thickness in a range from about 0.1 nm to about 10 nm. The ferromagnetic reference layer 215 has a magnetization direction that is "fixed," because the magnetization direction of the reference layer 215 is pinned by the pinned layer 213.

The MTJ stack 116 includes a tunnel barrier layer 112 formed over the reference layer 215. The tunnel barrier layer 112 is thick enough to avoid quantum mechanical tunneling of current between the ferromagnetic reference layer 215 and the ferromagnetic free layer 216. As a result, the MTJ stack 116 can be operated using VCMA without a current flowing through the MTJ stack (i.e., tunneling through the tunnel barrier layer 112). Specifically, when a VCMA voltage source is coupled to the free layer 216, the VCMA voltage source basically applies a VCMA voltage on the tunnel barrier layer 112. In some embodiments, the VCMA voltage is sufficiently large to overcome/eliminate the energy barrier accumulated by the tunnel barrier layer 112 that prevents the switching between the AP state and the P state of the MTJ stack 116. At the same while, the VCMA voltage is not so large as to break the dielectric barrier of the tunnel barrier layer 112 like in the STT-MRAM and/or SOT-MRAM configurations. For this reason, in some embodiments, the tunnel barrier layer 112 has a larger thickness than that of STT-MRAM devices and/or SOT-MRAM devices which rely upon a thin tunnel barrier for allowing quantum mechanical tunneling of current through this thin tunnel barrier. Specifically, the tunnel barrier in the STT-MRAM devices and/or SOT-MRAM devices may have a smaller thickness than the free layer and the reference layer. In contrast, in some embodiments of the present disclosure, the tunnel barrier layer 112 may have a larger thickness than the free layer 216 and/or the reference layer 215 so as to inhibit a current tunneling through the tunnel barrier layer 112. In some embodiments, the tunnel barrier layer 112 may be the thickest layer among all layers in the MTJ stack 116. Because of the thick tunnel barrier layer 112, MTJ stack 116 can be written using VCMA without a current tunneling through the tunnel barrier layer 112. In some embodiments, the tunnel barrier layer 112 has a thickness in a range from about 0.5 nm to about 50 nm. In some embodiments, the tunnel barrier layer 112 can comprise crystalline barrier, such as magnesium oxide (MgO) or spinel ($MgAl_2O_4$ a.k.a. MAO); or an amorphous barrier, such as aluminum oxide ($AlO_x$) or titanium oxide ($TiO_x$). In some embodiments where the tunnel barrier layer 112 is single crystalline MgO, the relative permittivity (i.e., dielectric constant) of the MgO layer is generally about 9.9. If the MgO layer is extremely thin (e.g., about 3 nm), it will exhibit polycrystalline proper ty and have a relative permittivity of about 80.

The MTJ stack 116 includes a free layer 216 having a magnetization which is free to be switched by VCMA or a magnetic field without a current tunneling through the tunnel barrier layer 112. Therefore, the free layer 216 is capable of changing its magnetization direction between one of two magnetization states, which cause two different MTJ capacitances that correspond to the binary data states. For example, with the VCMA effect, an electric field is used to switch the MTJ state. It occurs by accumulation of electron charges induced by the electric field changing the occupation of atomic orbitals at the interface of the free layer. This and the spin-orbit interaction lead to a change of magnetic anisotropy. More specifically, two stable magnetization states of the free layer 216 are separated by an energy barrier ($E_b$). When a negative VCMA voltage is applied on the free layer 216 of the MTJ stack 116, and the amplitude of the voltage is equal to or larger than a critical voltage ($V_c$) which is a minimum voltage to eliminate the energy barrier of the MTJ, the energy barrier will be eliminated. Without the energy barrier, the magnetization (M) of the free layer 216 enters into a precession process that precessionally oscillates between two stable states, i.e., P state and AP state. Removal of the VCMA voltage ends the precession. With controlled timing of removing the VCMA voltage, which corresponds to a position of the magnetization at the end of the precession process, the magnetization of the free layer 216 will settle at one of the AP or P state determinatively. Specifically, after the VCMA voltage is removed to end the precession, the magnetization of the free layer 216 will settle at a perpendicular orientation adjacent to the precession end position. Resultantly, the magnetization state of the MTJ stack 116 can be switched or controlled by the VCMA voltage pulse duration.

In some embodiments, the free layer 216 may be a ferromagnetic layer formed of a ferromagnetic material, such as iron, nickel, cobalt and alloys thereof, for example. For instance, in some embodiments, the free layer 216 can comprise cobalt, iron, and boron, such as a CoFeB ferromagnetic free layer. In some embodiments, the free layer 216 is a multilayer structure including a stack of a CoFeB layer, a metal spacer layer, and another CoFeB layer. In some embodiments, directions of easy magnetization axes of the reference layer 215 and the free layer 216 are in-plane (i.e., parallel with top and bottom surfaces of the stacked layers). In some other embodiments, directions of easy magnetization axes of the reference layer 214 and the free layer 216 are perpendicular (i.e., perpendicular to top and bottom surfaces of the stacked layers). The MTJ stack 116 further includes a capping layer 217 formed over the free layer 216. In some embodiments, the capping layer 217 includes Ta, Ru, MgO, the like, or combinations thereof. In some embodiments, the geometry of the MTJ stack 116 includes rectangular, square, or the like, and the geometry of the MTJ stack 116 may have rounded corners. In some embodiments, the MTJ stack 116 has a junction size in a range from about 1 nm to about 1 μm. In some embodiments, each layer of the MTJ stack 116 may be formed by PVD, ALD, CVD, and/or other suitable deposition techniques.

In some embodiments, the gate dielectric layer 108 illustrated in FIG. 1 serves to electrically isolate the MTJ stack 116 from the semiconductor fin 102, so that the MTJ stack 116 can be controlled by the VCMA voltage applied by the metal gate 118. The gate dielectric layer 108 includes an interfacial layer and a high-k dielectric layer over the interfacial layer. High-k dielectrics, as used and described herein, include dielectric materials having a high dielectric constant, for example, greater than that of thermal silicon oxide (~3.9). The interfacial layer of the gate dielectric layer 108 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 108 may include hafnium oxide ($HfO_2$). Alternatively, the gate dielectric layer 108 may include other high-k dielectrics, such as hafnium silicon oxide (HfSiO), hafnium oxynitride (HfON), hafnium silicon oxynitride (HfSiON), hafnium tantalum oxide (HfTaO), hafnium titanium oxide (HfTiO), hafnium zirconium oxide (HfZrO), lanthanum oxide ($La_2O_3$), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

In some embodiments, the metal gate 118 illustrated in FIG. 1 is a transistor gate terminal and can serve as a VCMA voltage source to apply a VCMA voltage on the MTJ stack 116, especially on the soft magnetic layer 114 that is in contact with the metal gate 118. In some other embodiments, the hard magnetic layer 110 is disposed above the tunnel barrier layer 112 and the soft magnetic layer 114 is disposed under the tunnel barrier layer 112. In this scenario, the metal gate 118 is in contact with the hard magnetic layer 110 to apply a VCMA voltage on the MTJ stack 116. When the gate voltage is large enough to eliminate the energy barrier of the MTJ stack 116, the magnetization state of the MTJ stack 116 can be switched from P state to AP state (also called P-to-AP switching), or from AP state to P state (also called AP-to-P switching), which in turn achieving a write operation of the memory device 10. In some embodiments, the free layer 216 of the soft magnetic layer 114 may be more stable in AP state than in P state, which results in energy barrier asymmetry between the AP state and the P state. In this scenario, the P-to-AP switching can be triggered by a lower gate voltage than the AP-to-P switching.

In some embodiments, the metal gate 118 includes one or more n-type work function metal (N-metal) layers and/or one or more p-type work function metal (P-metal) layers. The n-type work function metals may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), tungsten (W), metal carbides (e.g., hafnium carbide (HfC), zirconium carbide (ZrC), titanium carbide (TiC), aluminum carbide (AlC), tungsten carbide (WC)), aluminides, and/or other suitable materials. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The metal gate 118 may further include a fill metal to fill remainder of the recess defined by the U-shaped MTJ stack 116. The fill metal may exemplarily include, but not limited to, tungsten, aluminum, copper, nickel, cobalt, titanium, tantalum, titanium nitride, tantalum nitride, tungsten nitride, nickel silicide, cobalt silicide, TaC, TaSiN, TaCN, TiAl, TiAlN, or other suitable materials.

Figure 3:
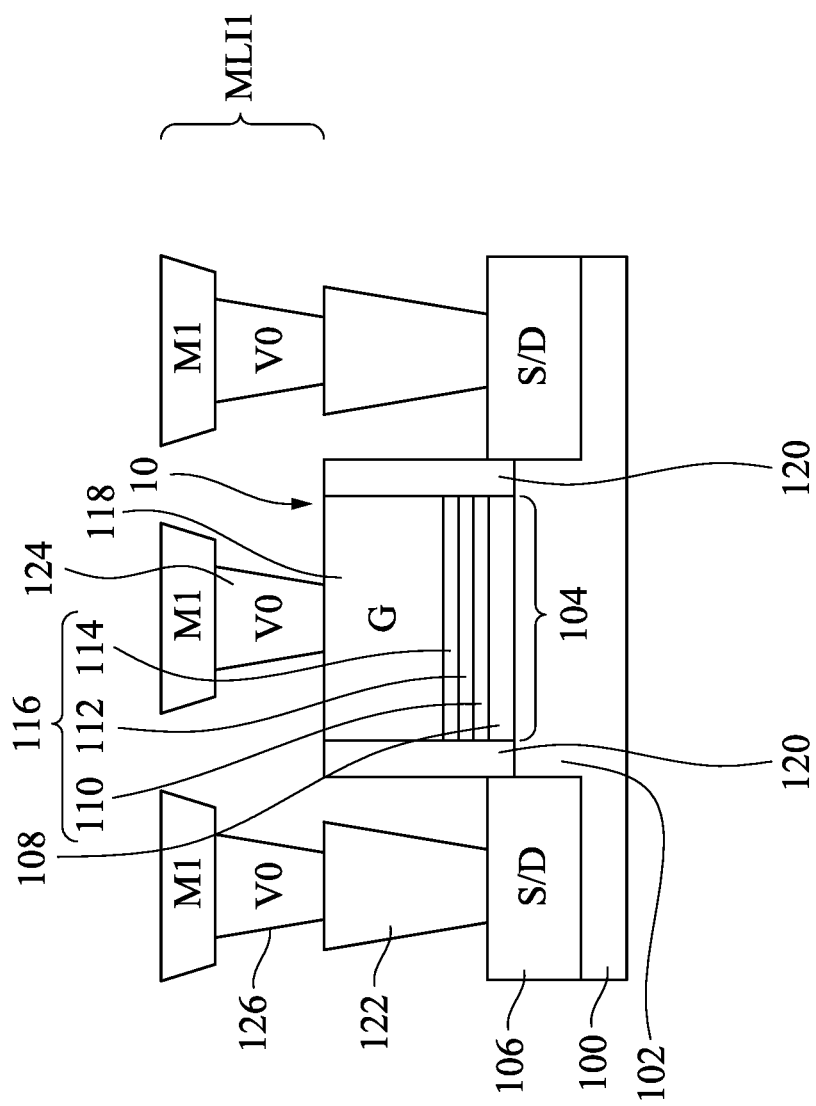
FIG. 3 is cross-sectional view of an example IC structure comprising an MeFET-based memory device in accordance with some embodiments of the present disclosure.

In some embodiments as illustrated in FIG. 1, each of the gate dielectric layer 108, the hard layer 110, the tunnel barrier layer 112, and the soft layer 114 has a U-shaped cross-section. This is because the MTJ-containing gate stack 104 is formed using a gate-last process flow, which will be described in greater detail below. In some other embodiments where the MTJ-containing gate stack 104 is formed using a gate-first process flow, each of the gate dielectric layer 108, the hard layer 110, the tunnel barrier layer 112, and the soft layer 114 has a line-shaped cross-section, as illustrated in FIG. 3.

Source/drain regions 106 and gate spacers 120, illustrated in FIG. 1, are formed, for example, self-aligned to the MTJ-containing gate structure 104. Gate spacers 120 may include one or more dielectrics, such as silicon oxide, silicon nitride, silicon oxynitride, silicon carbide, silicon carbonitride, the like, or a combination thereof. The gate spacers 120 serve to laterally space the MTJ-containing gate structure 104 apart from the source/drain regions 106. The source/drain regions 106 are semiconductor regions in direct contact with the semiconductor fin 102. In some embodiments, the source/drain regions 106 may comprise an epitaxially grown region. For example, after forming the gate spacers 120, the source/drain regions 106 may be formed self-aligned to the spacers 120 by first etching the fin 102 to form recesses, and then depositing a crystalline semiconductor material in the recess by a selective epitaxial growth (SEG) process that may fill the recess and may extend beyond the original surface of the fin 102 to form raised source/drain epitaxy structures 106, as illustrated in FIG. 1. The crystalline semiconductor material may be elemental (e.g., Si, or Ge, or the like), or an alloy (e.g., $Si_{1-x}$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A suitable dose (e.g., from about $10^{17}$ $cm^{-2}$ to $10^{22}$ $cm^{-2}$) of dopants may be introduced into the source/drain regions 106 either in situ during SEG, or by an ion implantation process performed after the SEG, or by a combination thereof. In some embodiments, geometry of the source/drain regions 106 may be diamond-shaped, circular, polygonal, or the like, and the source/drain regions 106 may have rounded corners.

The semiconductor fin 102 serves as a transistor channel region extending between the source/drain regions 106. The source-drain current depends on the threshold voltage of the transistor, which depends on the gate capacitance of the gate structure 104. Moreover, the gate capacitance depends on the MTJ capacitance that has binary values respectively corresponding to AP state and P state. Resultantly, for a same given gate voltage, the source-drain current obtained when the MTJ stack 116 is in AP state can be different from the source-drain current obtained when the MTJ stack 116 in P state. Such source-drain current difference can be used to identify the magnetization state of the MTJ stack 116, and thus the data state of the MeFET-based memory device 10 can be read out by using the source-drain current.

Specifically, a total gate capacitance $C_{total}$ of the gate structure 104 includes a gate dielectric capacitance $C_{ox}$ and an MTJ capacitance $C_{MTJ}$ in series, and thus their relation can be expressed as: $1/C_{total}=1/C_{ox}+1/C_{MTJ}$. Therefore, the MTJ capacitance $C_{MTJ}$ is in positive correlation with the gate capacitance $C_{total}$. Moreover, the transistor's threshold voltage ($V_t$) is in negative correlation with the gate capacitance $C_{total}$, and the source-drain current (e.g., drain saturation current $I_{dsat}$) is in negative correlation with the transistor's threshold voltage. Resultantly, the lower the MTJ capacitance, the smaller source-drain current is generated; the higher the MTJ capacitance, the larger source-drain current is generated. Because the MTJ capacitance in AP state is generally lower than that in P state, the MeFET-based memory device 10 in the read operation may have a smaller source-drain current corresponding to a first data state (e.g., logical "0"), and a larger source-drain current corresponding to a second data state (e.g., logical "1").

Figure 4B:
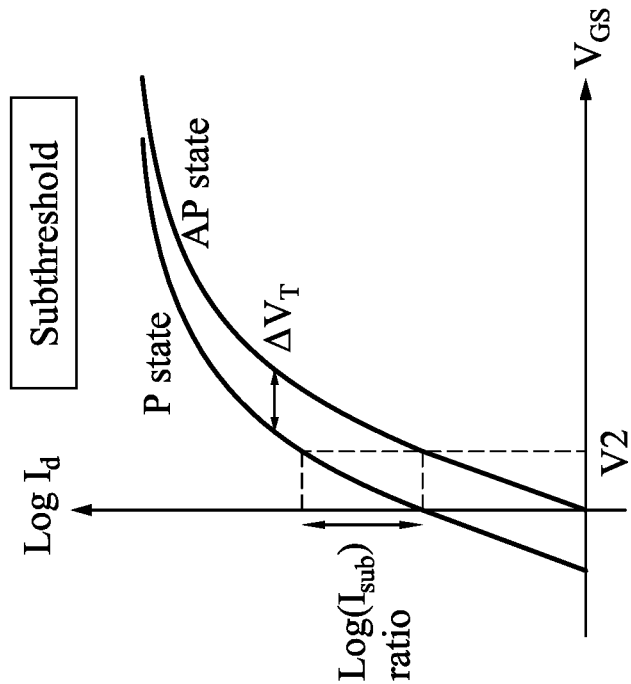
FIGS. 4A and 4B illustrate a current-voltage characteristic of an MeFET-based memory device in accordance with some embodiments of the present disclosure.
Figure 4A:
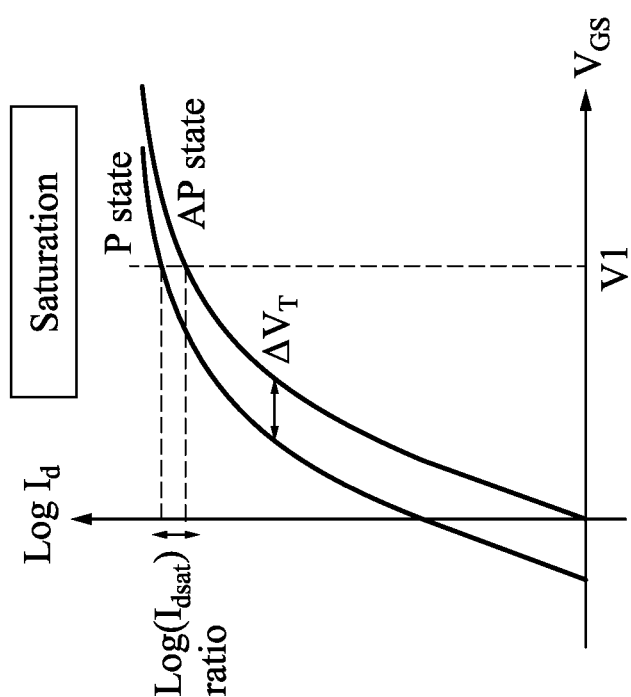

FIGS. 4A and 4B illustrate a current-voltage characteristic of an MeFET-based memory device (e.g., the memory device 10 as illustrated in FIG. 1 or 3), wherein FIG. 4A focuses on the current-voltage characteristic in the saturation region and FIG. 4B focuses on the current-voltage characteristic in the subthreshold region. In FIGS. 4A and 4B, the logarithm drain current (Log $I_d$) is shown on the vertical axis, and the gate-to-source voltage ($V_{GS}$) is shown on the horizontal axis. As illustrated in FIG. 4A, when the MeFET-based memory device is operated in the saturation region using a given gate-to-source voltage V1, there is a distinguishable drain saturation current ratio or difference between P state and AP state. As illustrated in FIG. 4B, when the MeFET-based memory device is operated in the subthreshold region using a given gate-to-source voltage V2 smaller than V1, there is also a distinguishable subthreshold drain current ratio or difference between P state and AP state. Therefore, the read operation of the MeFET-based memory device can be performed in the saturation region and/or the subthreshold region. Moreover, comparing FIG. 4B with FIG. 4A, the subthreshold drain current ratio between P state and AP state may be greater than the drain saturation current ratio between P state and AP state, and thus the read operation of the MeFET-based memory device performed in the subthreshold region may have a larger read window than that in the saturation region, in accordance with some embodiments of the present disclosure.

FIG. 5 is a chart providing example simulation results of read operations of various MeFET-based memory devices in saturation regions and subthreshold regions, in accordance with some embodiments of the present disclosure. In FIG. 5, Column1 shows magnetization states of MTJs of the MeFET-based memory devices, Column2 shows MTJ capacitances of the MeFET-based memory devices, Column3 shows total gate capacitances of the MeFET-based memory devices, Column4 shows differences between AP-state threshold voltages ($V_{TH, AP}$) and P-state threshold voltages ($V_{TH, P}$), Column5 shows ratios of P-state drain saturation current (Lisa, p) to AP-state drain saturation current ($I_{dsat, AP}$), and Column6 shows ratios of P-state subthreshold drain current ($I_{sub, P}$) to AP-state subthreshold drain current ($I_{sub, AP}$).

Row1 includes simulation results about a first MeFET-based memory device having a tunnel barrier (e.g., MgO) thickness in a range from 5 nm to about 7 nm (e.g., about 6 nm), an AP-state MTJ capacitance $C_{MTJ, AP}$ in a range from about 116 fF/um² to about 118 fF/um² (e.g., about 117.5 fF/um²), a tunnel magnetocapacitance (TMC) in a range from about 90% to about 100% (e.g., about 100%), gate dielectric capacitance $C_{ox}$ in a range from about 38 fF/um² to about 39 fF/um² (e.g., 38.4 fF/um²), and an equivalent oxide thickness in a range from about 0.85 nm to about 0.95 nm (e.g., about 0.9 nm). The TMC percentage can be expressed as: TMC=$(C_{MTJ, P}-C_{MTJ, AP})/C_{MTJ, AP}\times100\%$.

Row2 includes simulation results about a second MeFET-based memory device. The second MeFET-based memory device has similar conditions to the first MeFET-based memory device as discussed previously with respect to Row1, except that the second MeFET-based memory device has a smaller EOT in a range from about 0.37 nm to about 0.41 nm (e.g., about 0.39 nm) and thus has a larger gate dielectric capacitance $C_{ox}$ in a range from about 88 fF/um² to about 89 fF/um² (e.g., 88.5 fF/um²). Comparing simulation results of Row2 with Row1, it can be observed that reduction in gate dielectric thickness causes small increasing in the ratio of P-state drain saturation current to AP-state drain saturation current (e.g., the ratio increasing from about 1.41 to about 1.58), and causes almost no increasing in the ratio of P-state subthreshold drain current to AP-state subthreshold drain current (e.g., the ratio keeping at about 3.3). The simulation results show that reduction in gate dielectric thickness may lead to slight read window improvement in the read operation performed in saturation region, and may lead to no or negligible read window improvement in the read operation performed in subthreshold region.

Row3 includes simulation results about a third MeFET-based memory device. The third MeFET-based memory device has similar conditions to the second MeFET-based memory device as discussed previously with respect to Row2, except that the third MeFET-based memory device has a larger tunnel barrier thickness in a range from about 17 nm to about 19 nm (e.g., about 18 nm) and thus has a smaller MTJ capacitance. For example, the third MeFET-based memory device has an AP-state MTJ capacitance $C_{MTJ, AP}$ in a range from about 38 fF/um$^2$ to about 40 fF/um$^2$ (e.g., about 39.17 fF/um$^2$). Comparing simulation results of Row3 with Row2, it can be observed that increasing in tunnel barrier thickness causes significant increasing in the ratio of P-state drain saturation current to AP-state drain saturation current (e.g., the ratio increasing from about 1.58 to about 2.75), and also causes significant increasing in the ratio of P-state subthreshold drain current to AP-state subthreshold drain current (e.g., the ratio increasing from about 3.3 to about 36). The simulation results show that increasing in tunnel barrier thickness may lead to significant read window improvement in the read operation performed in either saturation region or subthreshold region.

Row4 includes simulation results about a fourth MeFET-based memory device. The fourth MeFET-based memory device has similar conditions to the third MeFET-based memory device as discussed previously with respect to Row3, except that the fourth MeFET-based memory device has a larger TMC percentage in a range from about 180% to about 200% (e.g., about 200%), which means the fourth MeFET-based memory device may have a greater difference between P-state MTJ capacitance $C_{MTJ, P}$ and AP-state MTJ capacitance $C_{MTJ, AP}$, and/or a smaller AP-state MTJ capacitance $C_{MTJ, AP}$. The TMC percentage depends upon materials of the MTJ stack, and thus can be controlled by selecting suitable materials for the MTJ stack. Comparing simulation results of Row4 with Row3, it can be observed that increasing in TMC percentage causes significant increasing in the ratio of P-state drain saturation current to AP-state drain saturation current (e.g., the ratio increasing from about 2.75 to about 3.93), and also causes significant increasing in the ratio of P-state subthreshold drain current to AP-state subthreshold drain current (e.g., the ratio increasing from about 36 to about 118). The simulation results show that increasing in TMC percentage may lead to significant read window improvement in the read operation performed in either saturation region or subthreshold region.

Based on the simulation results as shown in FIG. 5, especially Row2 and Row3, it is observed that making one or both of AP-state MTJ capacitance $C_{MTJ, AP}$ and the P-state MTJ capacitance $C_{MTJ, P}$ less than the gate dielectric capacitance $C_{OX}$ results in significant improvement in both the ratio of P-state drain saturation current to AP-state drain saturation current and the ratio of P-state subthreshold drain current to AP-state subthreshold drain current. This may be due to the fact that a smaller MTJ capacitance can dominate the total gate capacitance more significantly than a larger MTJ capacitance. Moreover, increasing the tunnel barrier thickness can reduce the MTJ capacitance. Therefore, in some embodiments, the tunnel barrier layer may be a thickest layer among all layers in the gate structure.

Referring back to FIG. 1, source/drain regions 106 of the MeFET-based memory device 10 may be electrically connected to conductive features of a first interconnect level MLI1 using conductive connectors (e.g., source/drain contacts 122). In some embodiments, the source/drain contacts 122 include suitable metals, such as W, Al, Cu, Ru, Ni, Co, alloys of these, combinations thereof, and the like. Multiple interconnect levels are formed over the source/drain contacts 122 and the MTJ-containing gate structure 104, in accordance with a back-end-of-line (BEOL) scheme adopted for the integrated circuit design. Each interconnect level includes conductive vias that extend in a vertical direction and conductive lines that extend in lateral directions. Generally, conductive vias conduct current vertically and are used to electrically connect two conductive features located at vertically adjacent levels, whereas conductive lines conduct current laterally and are used to distribute electrical signals and power within one level.

In FIG. 1, a bottommost one of the multiple interconnect levels is illustrated. The bottommost interconnect level ML1 includes a plurality conductive vias V0 vertically extending above the MTJ-containing gate structure 104 and source/drain contacts 122, and a plurality of conductive lines M1 laterally extending above the plurality of conductive vias V0. The conductive vias V0 includes a gate via 124 formed over the MTJ-containing gate structure 104, and source/drain vias 126 formed over the source/drain contacts 122. The gate via 124 electrically connects the metal gate 118 of the MTJ-containing gate structure 104 to a word line of the plurality of conductive lines M1, thereby applying a word line voltage to the metal gate 118 for writing and/or reading the MeFET-based memory device 10. In some embodiments, the gate via 124 is localized to the metal gate 118, and thus the MTJ stack 116 and the gate dielectric layer 108 are spaced apart from the gate via 124. The source/drain vias 126 electrically connect the source/drain contacts 122 respectively to a bit line and a source line of the plurality of conductive lines M1, for performing write operation and/or read operation for the MeFET-based memory device 10. In some embodiments, the word line, bit line and source line are at upper interconnect levels above the bottommost interconnect level ML1.

Figure 6:
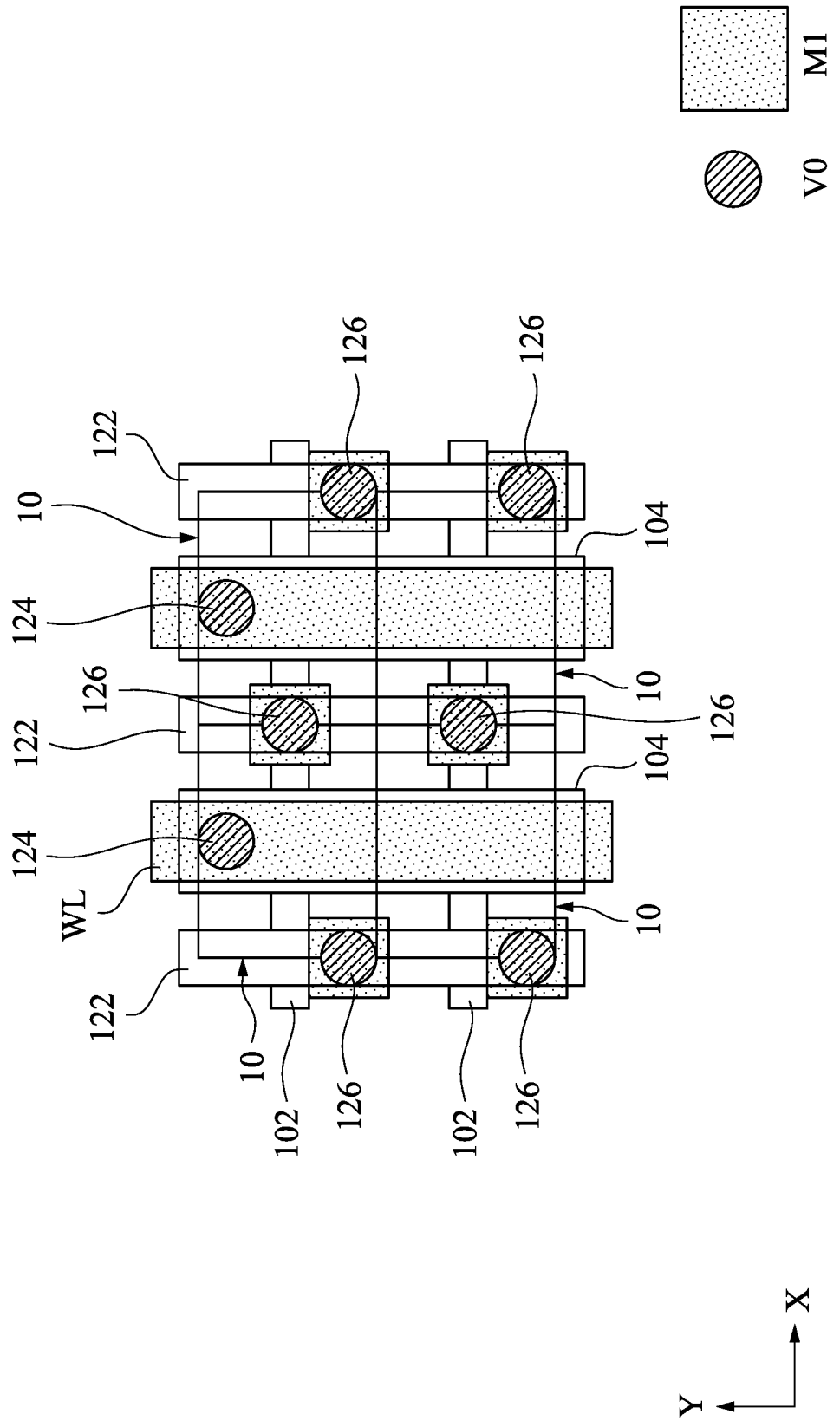
FIG. 6 illustrates an example overlaid layout of various levels of an IC structure having a plurality of MeFET-based memory devices, in accordance with some embodiments of the present disclosure.

FIG. 6 illustrates an example overlaid layout of various levels of an IC structure having a plurality of MeFET-based memory devices 10, in accordance with some embodiments of the present disclosure. FIG. 6 shows a two-by-two array of MeFET-based memory devices 10 (i.e., two columns×two rows) merely for illustrative purpose, not limiting the scope of the present disclosure. The MeFET-based memory devices 10 in a same row may share a same active region (e.g., semiconductor fin 102 or semiconductor nanosheet or nanowire which will be discussed in detail below). The MeFET-based memory devices 10 in a same column may share a same MTJ-containing gate structure 104. From a top view, the semiconductor fins 102 extend along a first direction (i.e., X-direction), and the MTJ-containing gate structures 104 and source/drain contacts 122 extend along a second direction (i.e., Y-direction) different from the first direction. In some embodiments, the first direction is perpendicular to the second direction. The word line WL extends along the Y-direction directly above the MTJ-containing gate structure 104, and thus the word line WL and the MTJ-containing gate structure 104 extend along a same direction and collectively resemble overlapping rectangular patterns having parallel longitudinal axes from the top view.

In some embodiments, the MTJ-containing gate structure 104 has a width in X-direction that is smaller than a width of the word line WL in X-direction. Therefore, the MTJ-containing gate structure 104 may laterally extend past opposite longitudinal sides of the word line WL as illustrated in FIG. 6. In some embodiments, the conductive lines M1 overlapping the respective source/drain vias 126 may be bit lines and source lines, or electrically coupled to bit lines and source lines at upper interconnect levels. The conductive lines M1 overlapping the source/drain vias 126 have a different top-view profile than the word line WL. For example, from top view the word line WL resembles a rectangular pattern extending along Y-direction, and the conductive lines M1 overlapping the source/drain vias 126 resemble square patterns. The conductive lines M1 overlapping the source/drain vias 126 thus have Y-directional dimensions smaller than the length of the word line WL measured in Y-direction.

Figure 7:
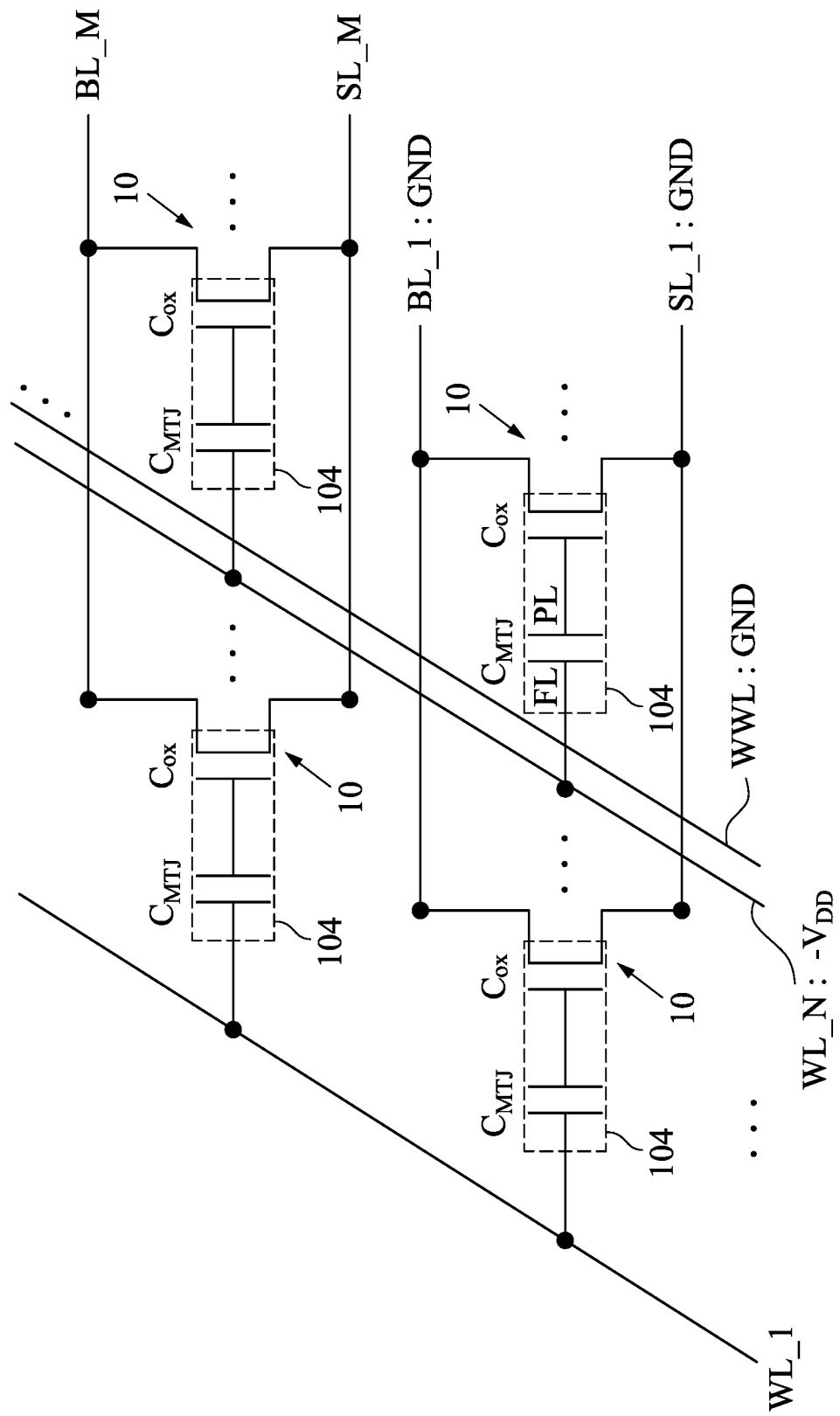
FIGS. 7 and 8 illustrate a write operation and a read operation of a circuit diagram of the IC structure of FIG. 6 according to some embodiments of the present disclosure.
Figure 8:
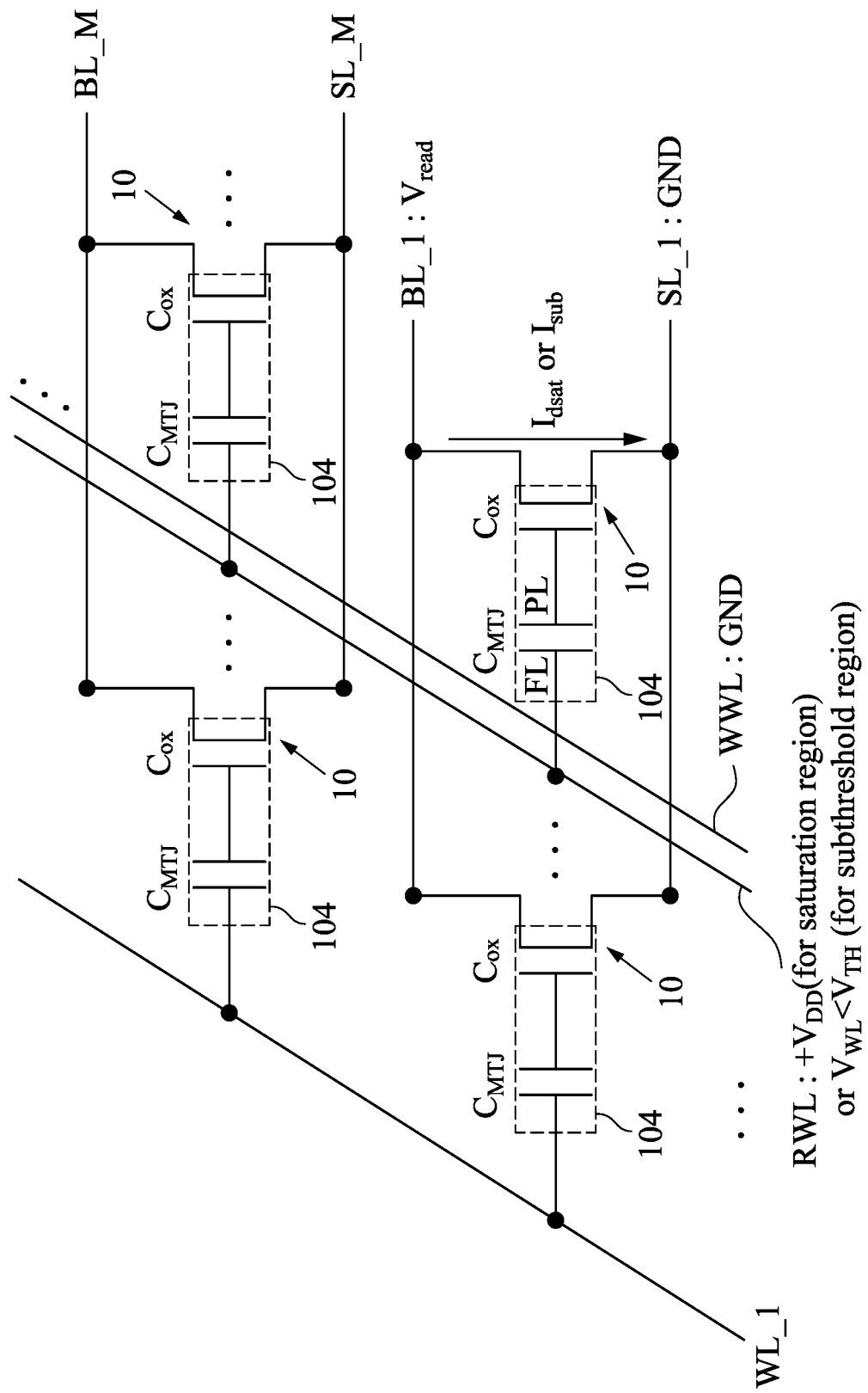

FIGS. 7 and 8 illustrate a write operation and a read operation of a circuit diagram of the IC structure of FIG. 6 according to some embodiments of the present disclosure. In FIGS. 7 and 8, the IC structure includes a plurality of word lines (e.g., WL_1, WL_2, . . . and WL_N) each electrically coupled to gate structures of MeFET-based memory devices 10 in a same column, a plurality of source lines (e.g., SL_1, SL_2, . . . and SL_M) each electrically coupled to source regions of MeFET-based memory devices 10 in a same row, and a plurality of bit lines (e.g., BL_1, BL_2, . . . and BL_M) each electrically coupled to drain regions of MeFET-based memory devices 10 in a same row.

In FIG. 7, in a write operation for the MeFET-based memory device 10 coupled to the word line WL_N, source line SL_1, and bit line BL_1, a negative voltage (e.g., $-V_{DD}$) is applied to the word line WL_N, and both the source line SL_1 and bit line BL_1 are grounded. The negative voltage applied to the free layer FL in the corresponding gate structure 104 can eliminate the energy barrier of the MTJ stack in the gate structure 104 by VCMA, thereby switching magnetization direction of the free layer (denoted as FL in FIG. 7) in the MTJ stack in the gate structure 104. In embodiments illustrated in FIG. 7, the free layer FL is electrically coupled to the word line WL_N, and the reference layer (denoted as PL) is electrically isolated from the word line WL_N. However, in some other embodiments, the word line WL_N may be electrically coupled to the reference layer PL and isolated from the free layer FL. In this scenario, the reference layer PL is formed above the free layer FL, and a positive voltage (e.g., $+V_{DD}$) is applied to the word line WL_N to trigger the write operation.

In FIG. 8, in a read operation for the MeFET-based memory device 10 coupled to the word line WL_N, source line SL_1, and bit line BL_1, a word line voltage $V_{WL}$ (e.g., $+V_{DD}$) is applied to the word line WL_N, a read voltage $V_{read}$ is applied to the bit line BL_1, and the source line SL_1 is grounded. $V_{DD}$ applied to the gate structure 104 allows for the MeFET-based memory device 10 being operated in the saturation region, thereby generating a drain saturation current $I_{dsat}$ for reading out the data state of the MeFET-based memory device 10. Alternatively, a word line voltage $V_{WL}$ lower than threshold voltage of the MeFET-based memory device 10 is applied to the word line WL_N, a read voltage $V_{read}$ is applied to the bit line BL_1, and the source line SL_1 is grounded. Word line voltage $V_{WL}$ lower than the threshold voltage of the MeFET-based memory device 10 allows for the MeFET-based memory device 10 being operated in the subthreshold region, thereby generating a subthreshold drain current ($I_{sub}$) for reading out the data state of the MeFET-based memory device 10.

Figure 9:
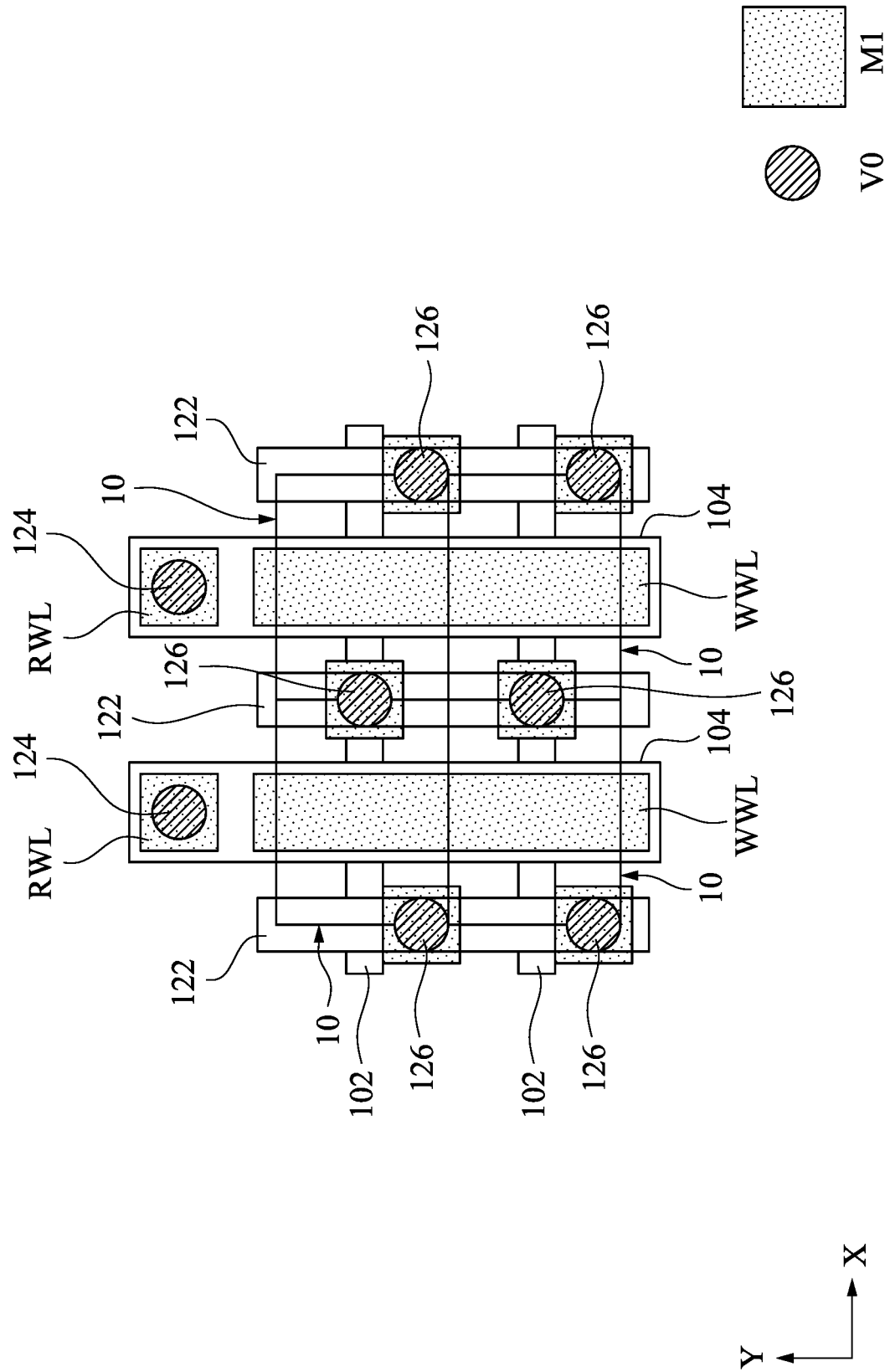
FIG. 9 illustrates an example overlaid layout of various levels of an IC structure having a plurality of MeFET-based memory devices, in accordance with some embodiments of the present disclosure.

FIG. 9 illustrates an example overlaid layout of various levels of an IC structure having a plurality of MeFET-based memory devices 10, in accordance with some embodiments of the present disclosure. The IC structure has similar elements and arrangement as the IC structure shown in FIG. 6, except that the IC structure further includes write word lines WWL disposed above the MTJ-containing gate structures 104 but electrically isolated from the MTJ-containing gate structures 104. In such embodiments, the magnetization direction of the free layer in the MTJ stack of each gate structure 104 is switched by using a magnetic field generated from a current flowing in a corresponding write word line WWL. The write word line WWL can thus be called a magnetic field inducing structure, which may have a top-view size (e.g., length, width, or diameter) in a range from about 0.1 nm to about 1 μm. In some embodiments, the write word lines WWL extend along the Y-direction directly above respective MTJ-containing gate structures 104, and thus a write word line WWL and a corresponding MTJ-containing gate structure 104 extend along a same direction and collectively resemble overlapping rectangular patterns having parallel longitudinal axes from the top view. In some embodiments, the MTJ-containing gate structure 104 has a width in X-direction that is smaller than a width of the write word line WWL in X-direction. Therefore, the MTJ-containing gate structure 104 may laterally extend past opposite longitudinal sides of the write word line WWL as illustrated in FIG. 9.

Moreover, in FIG. 9, the gate vias 124 electrically connect the respective gate structures 104 to read word lines RWL. A read word line RWL serves to apply a voltage to a corresponding gate structure 104 in the read operation, not in the write operation. The read word line RWL overlaps with a partial region of the gate structure 104, and has a smaller top-view area than the write word line WWL. For example, from top view the write word line WWL resembles a rectangular pattern extending along Y-direction, and the read word line RWL resembles a square pattern spaced apart from the rectangular pattern of the write word line by a Y-directional distance. From top view the gate via 124 is localized within the read word line RWL and spaced apart from the write word line WWL, so as to electrically couple the gate structure 104 to the read word line RWL and not to the write word line WWL.

Figure 10:
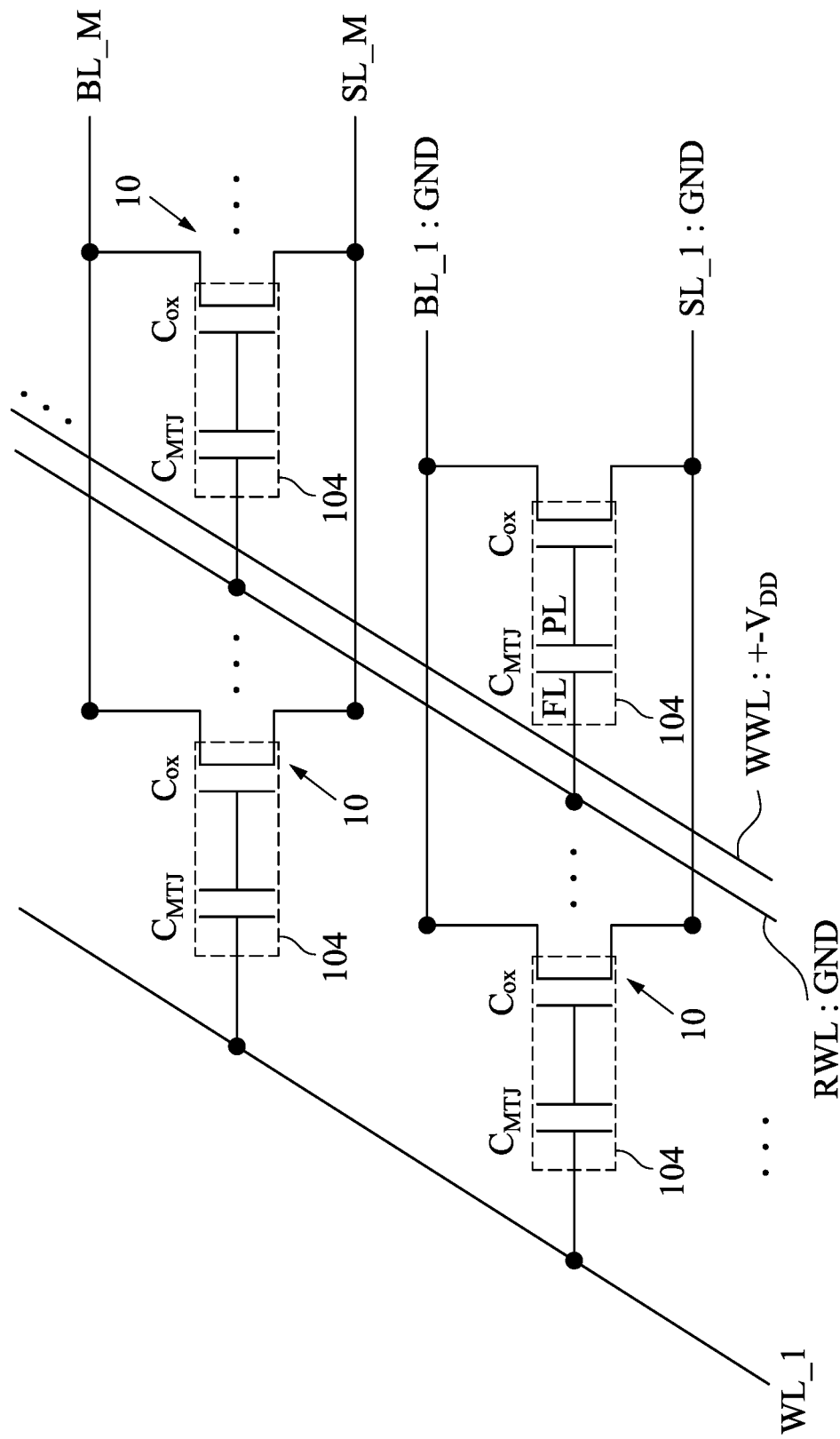
FIGS. 10 and 11 illustrate a write operation and a read operation of a circuit diagram of the IC structure of FIG. 9 according to some embodiments of the present disclosure.
Figure 11:
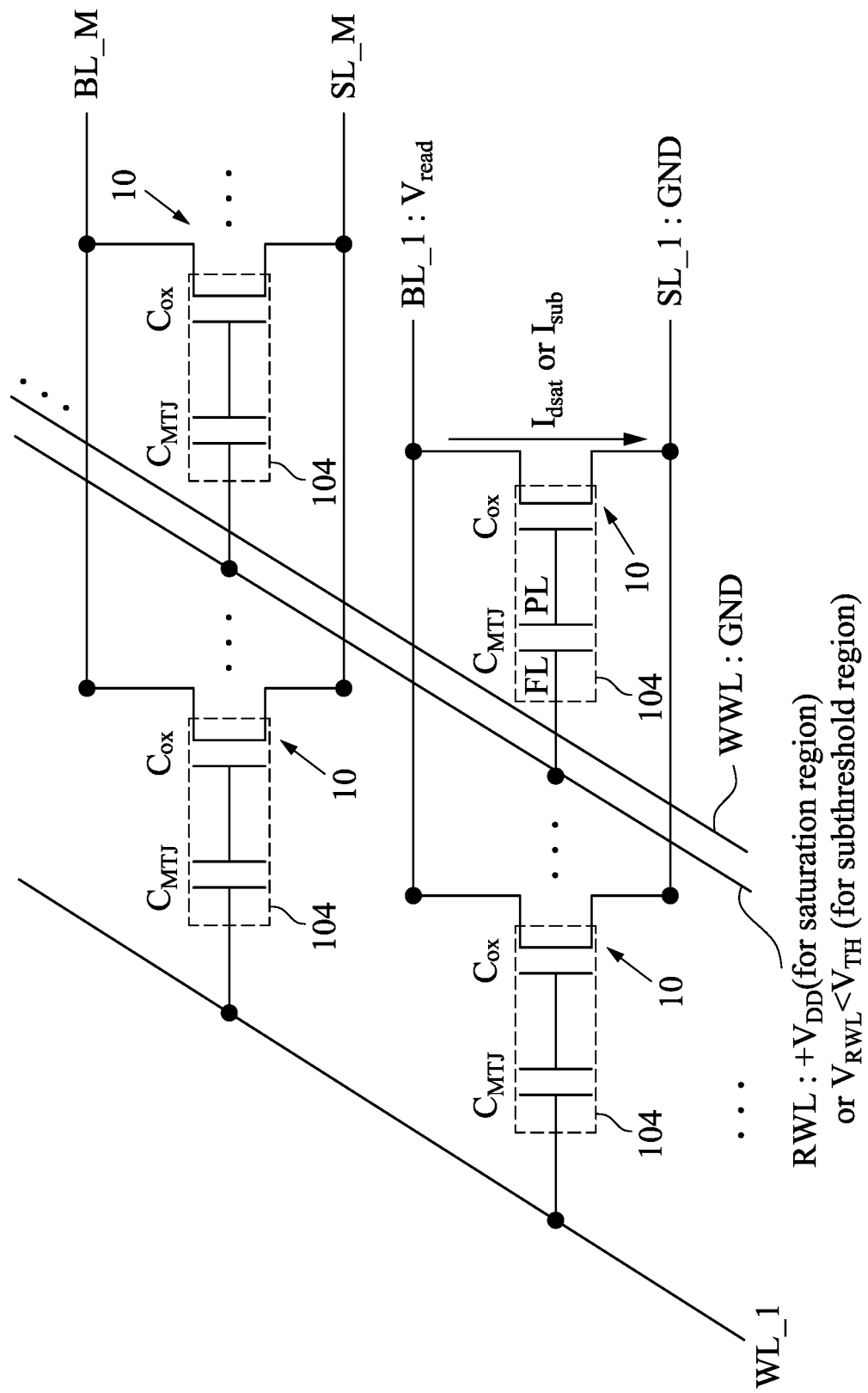

FIGS. 10 and 11 illustrate a write operation and a read operation of a circuit diagram of the IC structure of FIG. 9 according to some embodiments of the present disclosure. The circuit diagram has similar elements and configurations as the circuit diagram shown in FIGS. 7-8, except that the IC structure has a write word line WWL serving to write the MeFET-based memory devices 10 in a same column, and a read word line RWL serving to read the MeFET-based memory devices 10 in this column. In FIG. 10, in a write operation for the MeFET-based memory device 10 coupled to the read word line RWL, source line SL_1, and bit line BL_1, a write word line voltage (e.g., $+V_{DD}$ or $-V_{DD}$) is applied to the write word line WWL, and the source line SL_1, bit line BL_1, and the read word line RWL are grounded. The write word line voltage generates a current in the write word line WWL, creating a magnetic field large enough to switch the magnetization direction of the free layer FL of the MTJ stack in the corresponding gate structure 104.

In FIG. 11, in a read operation for the MeFET-based memory device 10 coupled to the read word line RWL, source line SL_1, and bit line BL_1, a read word line voltage $V_{RWL}$ (e.g., +$V_{DD}$) is applied to the read word line RWL, a read voltage $V_{read}$ is applied to the bit line BL_1, and the source line SL_1 and the write word line WWL are grounded. $V_{DD}$ applied to the gate structure 104 allows for the MeFET-based memory device 10 being operated in the saturation region, thereby generating a drain saturation current $I_{dsat}$ for reading out the data state of the MeFET-based memory device 10. Alternatively, a read word line voltage $V_{RWL}$ lower than threshold voltage of the MeFET-based memory device 10 is applied to the read word line RWL, a read voltage $V_{read}$ is applied to the bit line BL_1, and the source line SL_1 is grounded. Read word line voltage $V_{RWL}$ lower than the threshold voltage of the MeFET-based memory device 10 allows for the MeFET-based memory device 10 being operated in the subthreshold region, thereby generating a subthreshold drain current ($I_{sub}$) for reading out the data state of the MeFET-based memory device 10.

FIGS. 12-18 are cross-sectional views of intermediate stages in the manufacturing of an IC structure having MeFET memory devices, in accordance with some embodiments of the present disclosure. The manufacturing process steps can be used to fabricate the IC structure as illustrated in FIG. 1. It is understood that additional operations can be provided before, during, and after processes shown by FIGS. 12-18, and some of the operations described below can be replaced or eliminated, for additional embodiments of the method. The order of the operations/processes may be interchangeable.

Figure 12:
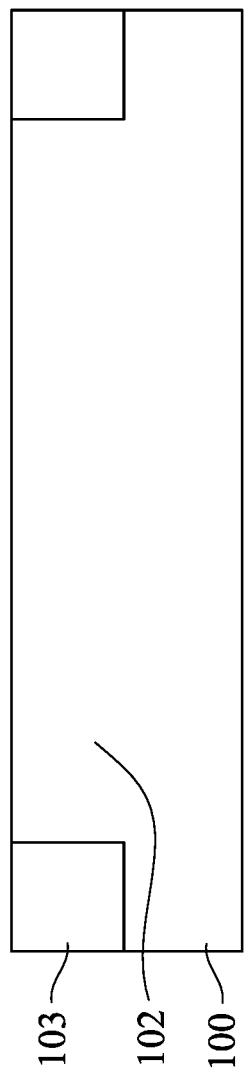
FIGS. 12-18 are cross-sectional views of intermediate stages in the manufacturing of an IC structure having MeFET memory devices, in accordance with some embodiments of the present disclosure.

FIG. 12 illustrates an initial structure that includes a substrate 100. The substrate 100 may be a semiconductor substrate, such as a bulk semiconductor, a fully depleted semiconductor-on-insulator (FD-SOI) substrate, or the like, which may be doped (e.g., with a p-type or an n-type dopant) or undoped. Other details about the substrate 100 are discussed previously with respect to FIG. 1, and thus they are not repeated for the sake of brevity. FIG. 12 also illustrates a fin 102 formed in the substrate 100. In some embodiments, the fin 102 may be formed in the substrate 100 by etching trenches in the substrate 100. The etching may be any acceptable etch process, such as a reactive ion etch (RIE), neutral beam etch (NBE), the like, or combinations thereof. The etch may be anisotropic.

The fins may be patterned by any suitable method. For example, the fin 102 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fin 102.

Once fins 102 are formed, an insulation material 103 is formed over the substrate 100 and between neighboring fins 102. The insulation material 103 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials formed by any acceptable process may be used. In the illustrated embodiment, the insulation material 103 is silicon oxide formed by a FCVD process. An anneal process may be performed once the insulation material is formed. In some embodiments, the insulation material 103 is formed such that excess insulation material 103 covers the fin 102. Although the insulation material 103 is illustrated as a single layer, some embodiments may utilize multiple layers. For example, in some embodiments a liner (not shown) may first be formed along a surface of the substrate 100 and the fins 102. Thereafter, a fill material, such as those discussed above may be formed over the liner.

Once the insulation material 103 is deposited over the fin 102, a removal process is applied to the insulation material 103 to remove excess insulation material 103 over the fin 102. In some embodiments, a planarization process such as a chemical mechanical polish (CMP), an etch-back process, combinations thereof, or the like may be utilized. The planarization process exposes the fin 102 such that top surface of the fin 102 and the insulation material 103 are level after the planarization process is complete.

Figure 13:
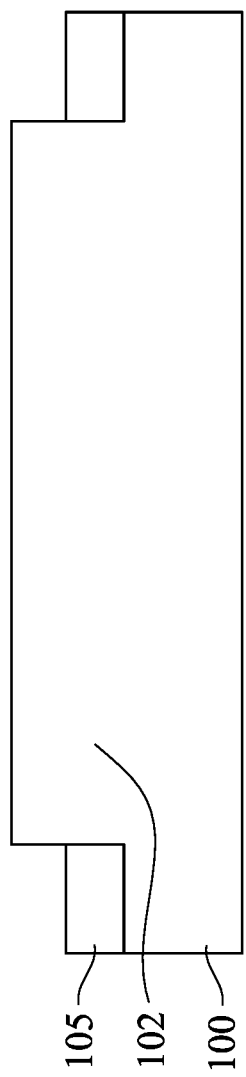

In FIG. 13, the insulation material 103 is recessed to form shallow trench isolation (STI) regions 105. The insulation material 103 is recessed such that upper portion of fin 102 protrudes from between neighboring STI regions 105. Further, the top surface of the STI region 105 may have a flat surface as illustrated, a convex surface, a concave surface (such as dishing), or combinations thereof. The top surface of the STI region 105 may be formed flat, convex, and/or concave by an appropriate etch. The STI region 105 may be recessed using an acceptable etching process, such as one that is selective to the material of the insulation material 103 (e.g., etches the material of the insulation material 103 at a faster rate than the material of the fin 102). For example, an oxide removal using, for example, dilute hydrofluoric (dHF) acid may be used.

The process described with respect to FIGS. 12-13 is just one example of how the fins 102 may be formed. In some embodiments, fins may be formed by an epitaxial growth process. For example, a dielectric layer can be formed over a top surface of the substrate 100, and trenches can be etched through the dielectric layer to expose the underlying substrate 100. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 102. For example, the fin 102 in FIGS. 12-13 can be recessed, and a material different from the fin 102 may be epitaxially grown over the recessed fin 102. In such embodiments, the fin 102 comprises the recessed material as well as the epitaxially grown material disposed over the recessed material. In an even further embodiment, a dielectric layer can be formed over a top surface of the substrate 100, and trenches can be etched through the dielectric layer. Heteroepitaxial structures can then be epitaxially grown in the trenches using a material different from the substrate 100, and the dielectric layer can be recessed such that the heteroepitaxial structures protrude from the dielectric layer to form the fins 102. In some embodiments where homoepitaxial or heteroepitaxial structures are epitaxially grown, the epitaxially grown materials may be in-situ doped during growth, which may obviate prior and subsequent implantations although in situ and implantation doping may be used together.

Figure 14:
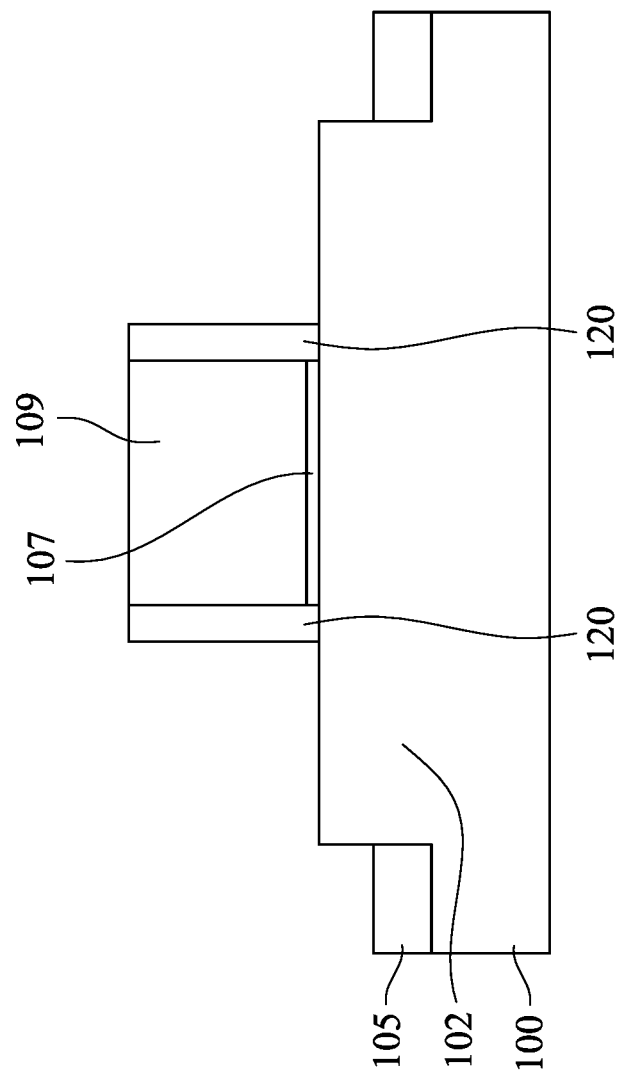

In FIG. 14, a dummy gate dielectric layer 107 is formed over the fin 102, and a dummy gate structure 109 is formed over the dummy gate dielectric layer 107. Formation of the dummy gate dielectric layer 107 and the dummy gate structure 109 includes, for example, depositing a layer of dielectric material over the fin 102 and a layer of dummy gate material over the layer of dielectric material by using suitable deposition techniques, followed by patterning the layer of dummy gate material into the dummy gate structure 109 and patterning the layer of dielectric material into the dummy gate dielectric layer 107 by using suitable photolithography and etching techniques. The resultant dummy gate structure 109 has a longitudinal axis perpendicular to the longitudinal axis of the fin 102. In some embodiments, the dummy gate dielectric layer 107 may be, for example, silicon oxide, silicon nitride, a combination thereof, or the like, and may be deposited or thermally grown according to acceptable techniques. The dummy gate structure 109 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals.

After the dummy gate structure 109 is formed, gate spacers 120 are formed on sidewalls of the dummy gate structure 109. In some embodiments of the spacer formation step, a spacer material layer is deposited on the substrate 100. The spacer material layer may be a conformal layer that is subsequently etched back to form gate sidewall spacers. In the illustrated embodiment, a spacer material layer is disposed conformally on top and sidewalls of the dummy gate structure 109. The spacer material layer may include a dielectric material such as silicon oxide, silicon nitride, silicon carbide, silicon oxynitride, SiCN films, silicon oxycarbide, SiOCN films, and/or combinations thereof. The spacer material layer may be formed by depositing a dielectric material over the dummy gate structure 109 using processes such as, CVD process, a subatmospheric CVD (SACVD) process, a flowable CVD process, an ALD process, a PVD process, or other suitable process. An anisotropic etching process is then performed on the deposited spacer material layer to expose portions of the fin 102 not covered by the dummy gate structure 109 (e.g., in source/drain portions of the fin 102). Portions of the spacer material layer directly above the dummy gate structure 109 may be completely removed by this anisotropic etching process. Portions of the spacer material layer on sidewalls of the dummy gate structure 109 may remain, forming gate sidewall spacers, which is denoted as the gate spacers 120, for the sake of simplicity.

Figure 15:
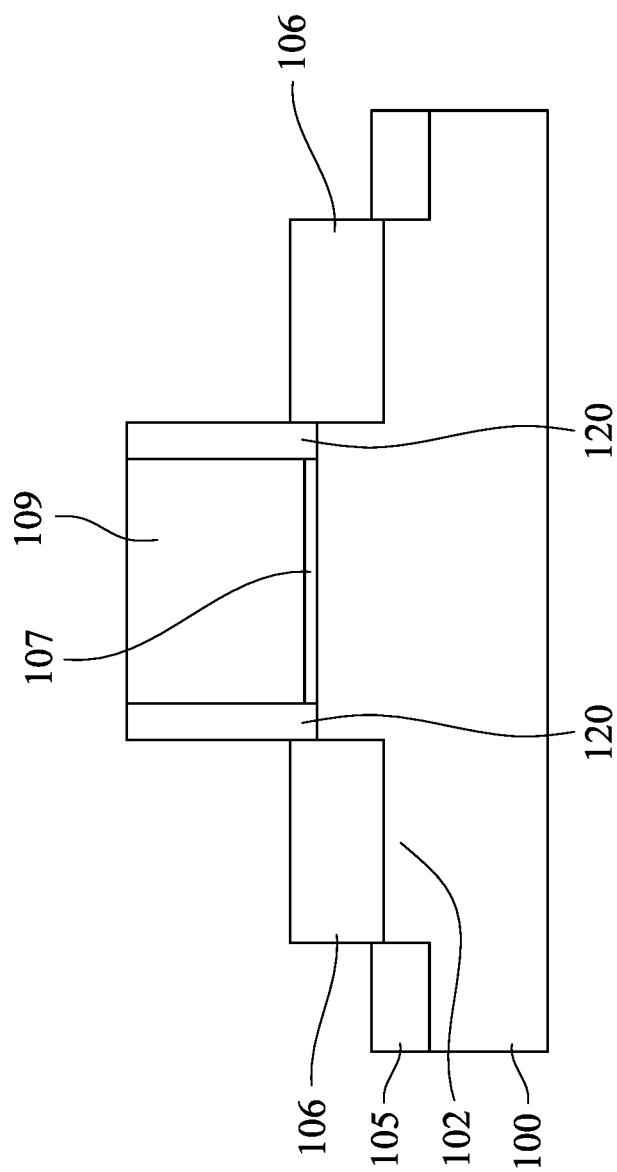

In FIG. 15, after the gate spacers 120 are formed, epitaxial source/drain regions 106 are formed on the fin 102 and on opposite sides of the dummy gate structure 109. For example, exposed portions of the semiconductor fin 102 that extend laterally beyond the gate spacers 120 (e.g., in source and drain portions of the fin 102) are etched by using, for example, an anisotropic etching process that uses the dummy gate structure 109 and the gate spacers 120 as an etch mask, resulting in recesses into the semiconductor fin 102. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof. Then, the epitaxial source/drain regions 106 are epitaxially grown in the recesses of the fin 102. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor material of the fin 102. In some embodiments, an epitaxial material may be deposited by a selective epitaxial growth (SEG) process to fill the recesses of the fin 102 and extend further beyond the original surface of the semiconductor fin 102 to form raised epitaxy structures 106, which have top surfaces higher than top surfaces of the semiconductor fin 102.

In some embodiments where the MeFET is an n-type transistor, the epitaxial source/drain regions 106 may include any acceptable material appropriate for n-type FETs. For example, if the fin 102 is silicon, the epitaxial source/drain regions 106 may include materials exerting a tensile strain on the fin 102, such as silicon carbide, phosphorous doped silicon carbide, silicon phosphide, or the like. In some embodiments where the MeFET is a p-type transistor, the epitaxial source/drain regions 106 may include any acceptable material appropriate for p-type FETs. For example, if the fin 102 is silicon, the epitaxial source/drain regions 106 may comprise materials exerting a compressive strain on the fin 102, such as silicon germanium, boron doped silicon germanium, germanium, germanium tin, or the like. The epitaxial source/drain regions 208 may have surfaces raised from respective the upper surface of the upper channel layer 204C and may have facets. In some embodiments, the epitaxial source/drain regions 208 include Si, Ge, Sn, $Si_{1-x}Ge_x$, $Si_{1-x-y}Ge_xSn_y$, or the like.

The epitaxial source/drain regions 106 may be implanted with dopants to form source/drain regions, followed by an anneal process. The source/drain regions may have an impurity concentration, for example, between about $1\times10^{17}$ atoms/cm$^3$ and about $1\times10^{22}$ atoms/cm$^3$. The dopants are, for example, boron or gallium for a p-type MeFET, and phosphorus or arsenic for an n-type MeFET. In some embodiments, the epitaxial source/drain regions 106 may be in situ doped during growth.

Figure 16:
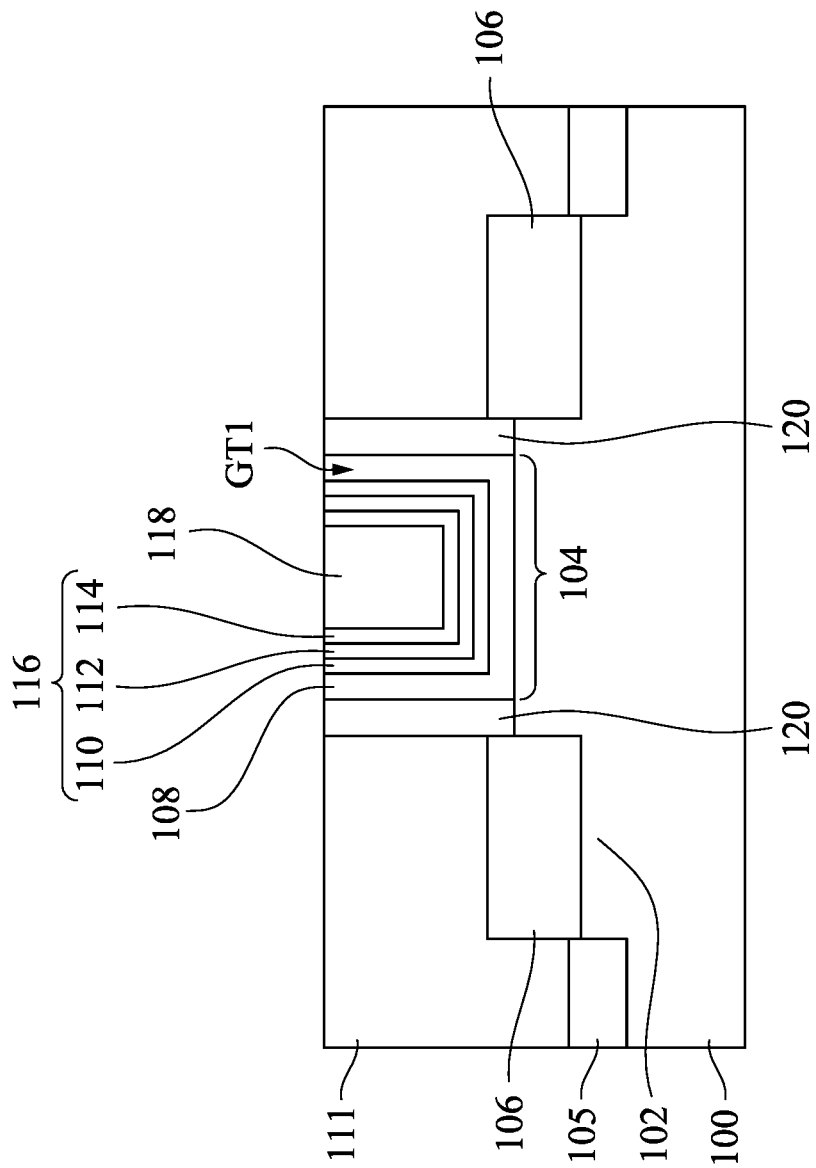

In FIG. 16, a first ILD layer 111 is formed over the substrate 100. The first ILD layer 111 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. Then, a planarization process, such as a CMP, may be performed to level the top surface of the first ILD layer 111 with the top surface of the dummy gate structure 109 (as illustrated in FIG. 15).

Afterwards, the dummy gate structure 109 and the dummy gate dielectric layer 107 are removed, thereby forming a gate trench GT1 between gate spacers 120. Then, the MTJ-containing gate structure 104 is formed in the gate trench GT1 to complete the gate-last process flow. Specifically, the gate dielectric layer 108, the hard magnetic layer 110, the tunnel barrier layer 112, the soft magnetic layer 114, and the metal gate 118 are deposited in sequence to overfill the gate trench GT1, followed by performing a CMP process to remove excess portions of these layers outside the gate trench GT1. In this way, the MTJ-containing gate structure 104 is formed in the gate trench GT1 and has a top surface substantially coplanar with a top surface of the first ILD layer 111. Materials and other details about the MTJ-containing gate structure 104 are discussed previously with respect to FIG. 1, and thus they are not repeated for the sake of brevity. The MTJ-containing gate structure 104, an underlying channel region in the semiconductor fin 102, and source/drain regions 106 on opposite sides of the MTJ-containing gate structure 104 collectively serve as an MeFET-based memory device. The MeFET-based memory device can be simultaneously formed with the front-end-of-line (FEOL) process of forming other transistors (e.g., logic transistors), instead of fabricated in the BEOL process of forming the multilevel interconnect structure.

Figure 17:
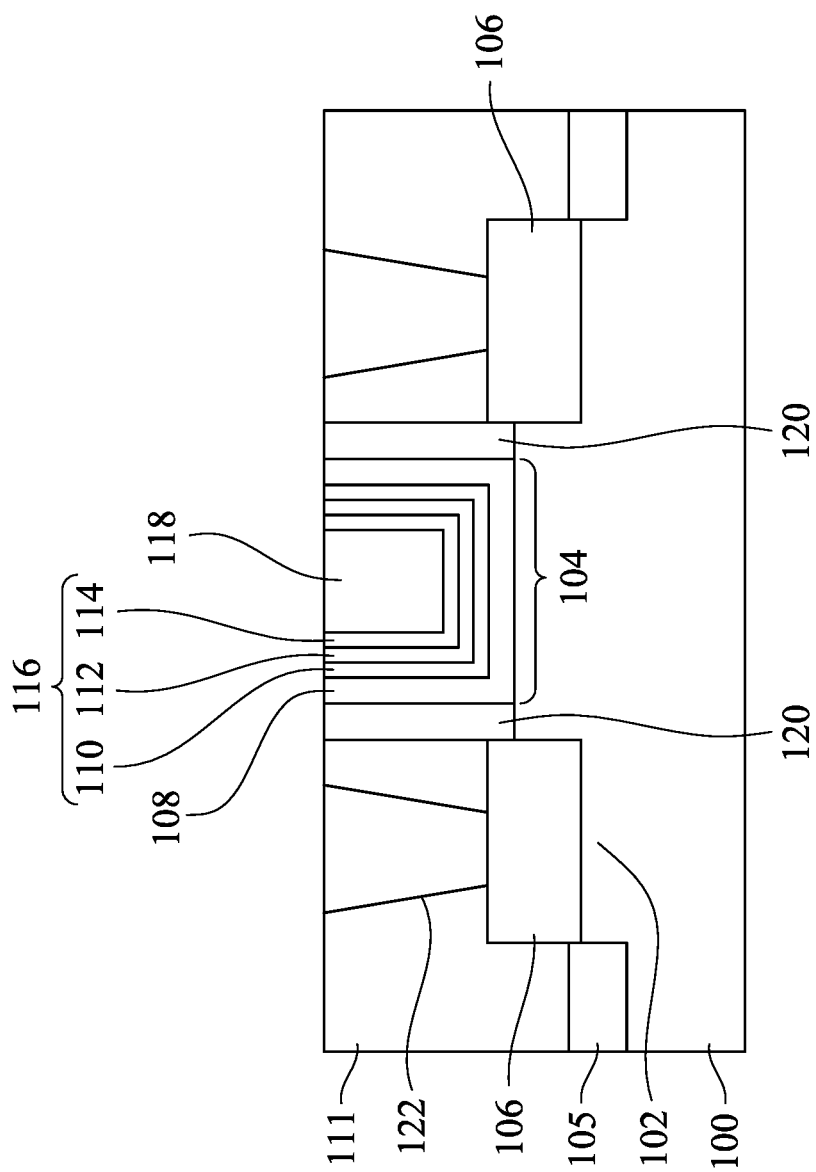

In FIG. 17, source/drain contacts 122 are formed in the first ILD layer 111 and over the epitaxial source/drain regions 106. Formation of the source/drain contacts 122 includes, by way of example and not limitation, performing one or more etching processes to form contact openings extending though the first ILD layer 111 to expose the source/drain regions 106, depositing one or more metal materials (e.g., titanium nitride, tungsten, cobalt, copper, the like or combinations thereof) overfilling the contact openings by using suitable deposition techniques (e.g., CVD, PVD, ALD, the like or combinations thereof), and then performing a CMP process to remove excess metal materials outside the contact openings. Therefore, the CMP process may planarize the top surface of the source/drain contacts 122 with the top surface of the MTJ-containing gate structure 104.

Figure 18:
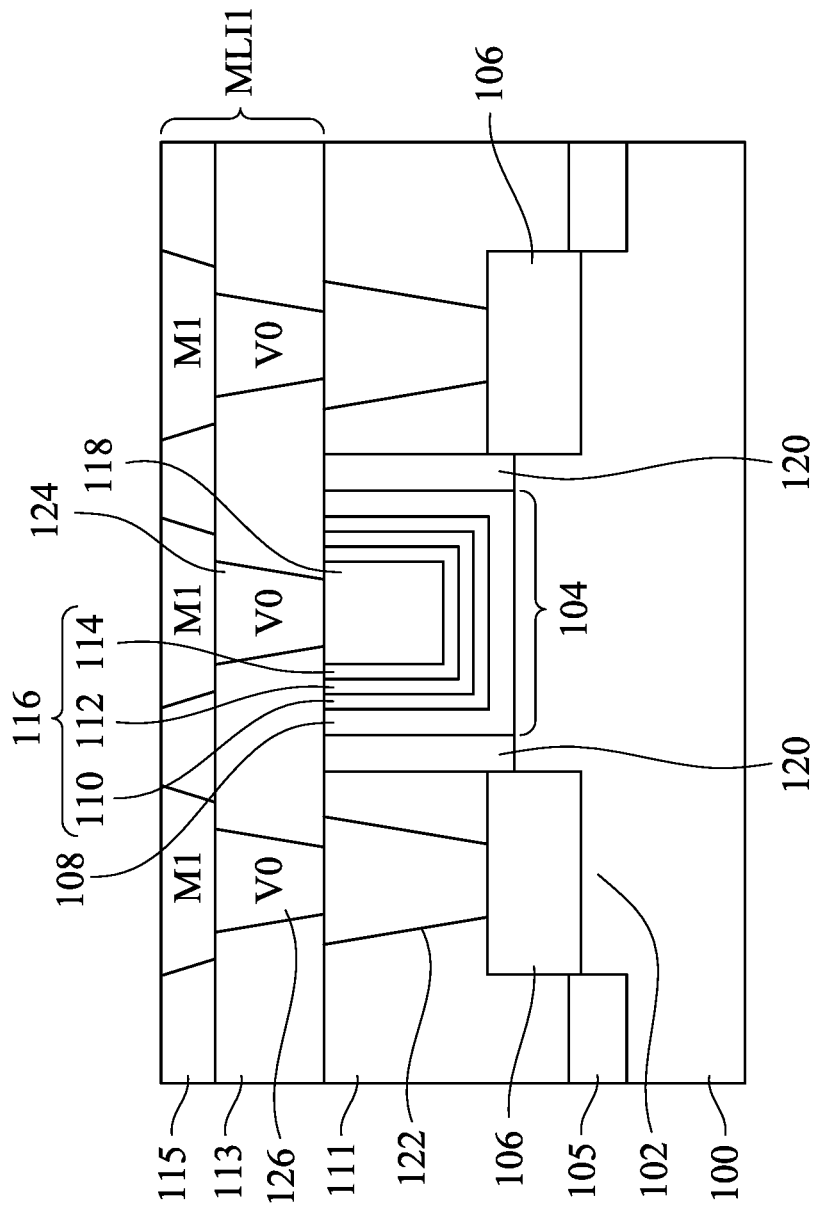

In FIG. 18, after the source/drain contacts 122 are formed in the first ILD layer 111, a first interconnect level ML1 is formed over the first ILD layer 111, the source/drain contacts 122, and the MTJ-containing gate structure 104. In some embodiments, a second ILD layer 113 is deposited over the first ILD layer 111 by using suitable deposition techniques. Promising candidates of the material of the second ILD layer 113 are similar to that of the first ILD layer 111, and thus they are not repeated for the sake of brevity. A plurality of conductive vias V0, which include gate via 124 and source/drain vias 126, are formed in the second ILD layer 113 by etching via openings in the second ILD layer 113, depositing one or more metal materials (e.g., titanium nitride, tungsten, cobalt, copper, ruthenium, the like or combinations thereof) in the via openings, and performing a CMP process to remove excess materials outside the via openings. A third ILD layer 115 is then formed over the second ILD layer 113 and the conductive vias V0 by using suitable deposition techniques. Promising candidates of the material of the third ILD layer 115 are similar to that of the first ILD layer 111, and thus they are not repeated for the sake of brevity. A plurality of conductive lines M1 are then formed in the third ILD layer 115 by etching trenches in the third ILD layer 115, depositing one or more metal materials (e.g., titanium nitride, tungsten, cobalt, copper, ruthenium, the like or combinations thereof) in the trenches, and performing a CMP process to remove excess materials outside the trenches. Descriptions about FIG. 18 are just one example of how the interconnect level ML1 may be formed. It is understood that the interconnect level ML1 and upper interconnect levels (not shown) subsequently formed over the interconnect level ML1 may be formed using any other suitable method, such as dual damascene processes.

Figure 19:
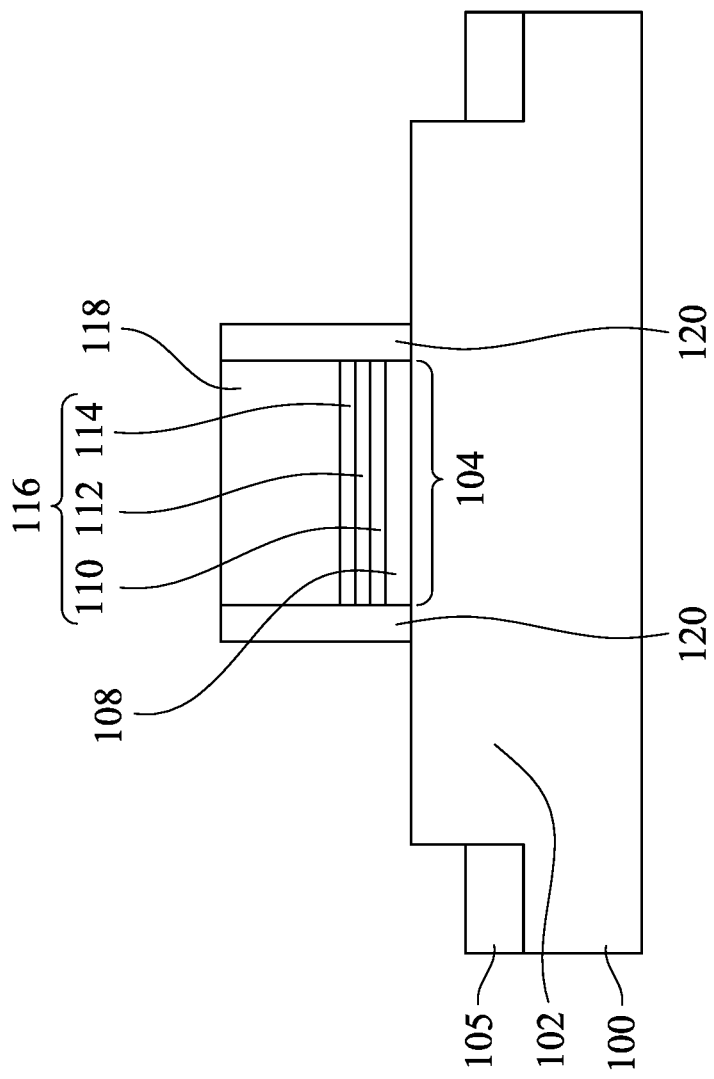
FIGS. 19-21 are cross-sectional views of intermediate stages in the manufacturing of an IC structure having MeFET memory devices, in accordance with some embodiments of the present disclosure.
Figure 20:
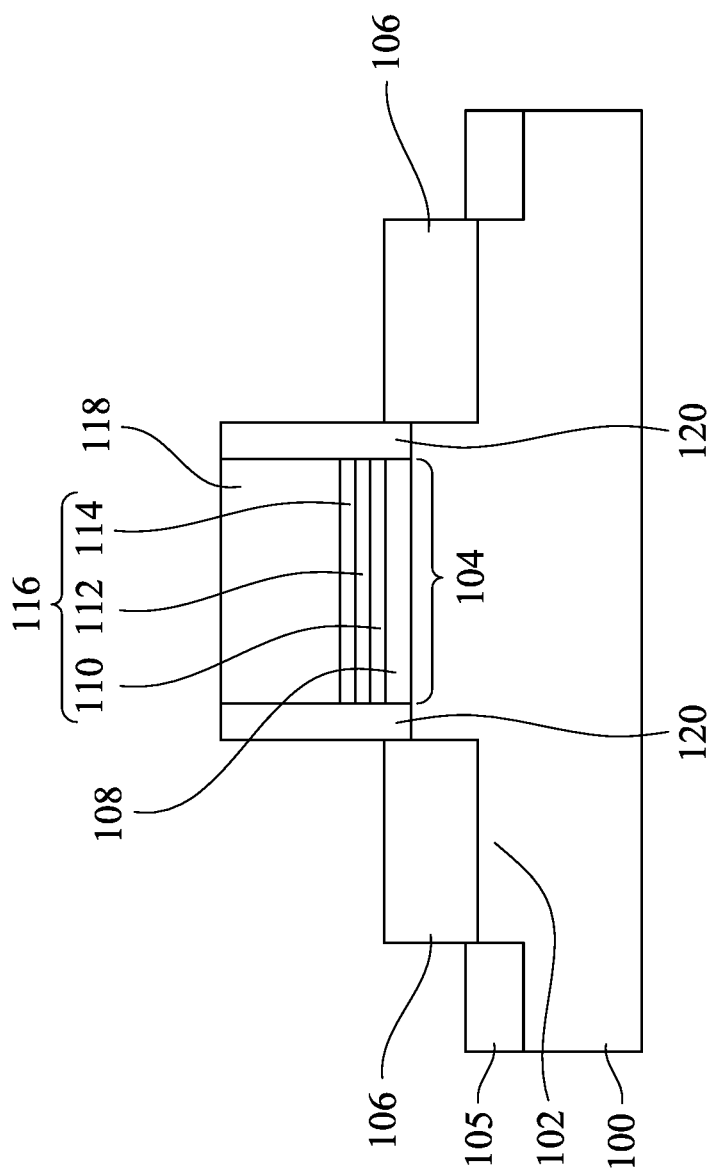
Figure 21:
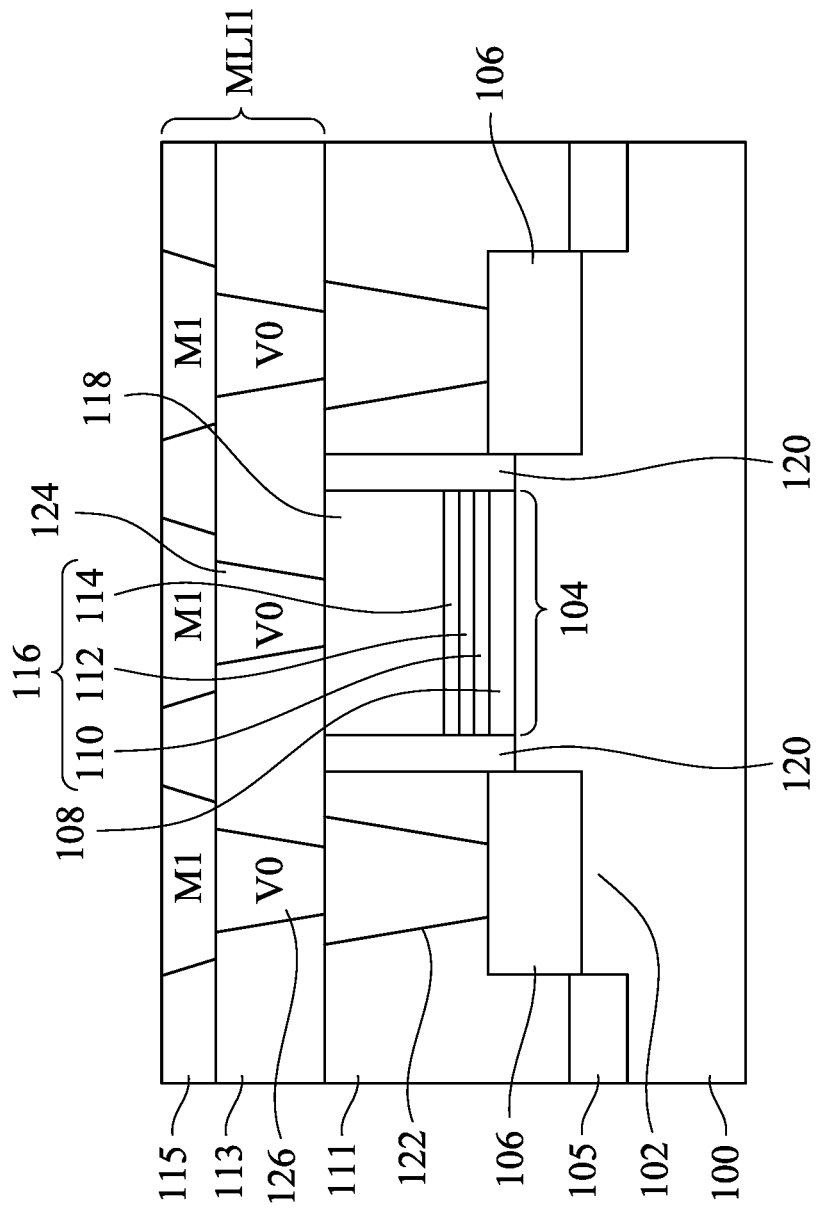

FIGS. 19-21 are cross-sectional views of intermediate stages in the manufacturing of an IC structure having MeFET memory devices, in accordance with some embodiments of the present disclosure. The manufacturing process steps can be used to fabricate the IC structure as illustrated in FIG. 3. It is understood that additional operations can be provided before, during, and after processes shown by FIGS. 19-21, and some of the operations described below can be replaced or eliminated, for additional embodiments of the method. The order of the operations/processes may be interchangeable.

In FIG. 19, after formation of the semiconductor fin 102 and STI regions 105 (the step as shown in FIG. 13) is complete, an MTJ-containing gate structure 104 is formed over the semiconductor fin 102 using a gate-first scheme, and thus the gate structure will remain in a final MeFET-based memory device, not being replaced with another gate structure in subsequent processing. Specifically, materials of the MTJ-containing gate structure 104 are deposited in sequence over the substrate 100, followed by an etching process to pattern these materials into the gate dielectric layer 108, the hard magnetic layer 110, the tunnel barrier layer 112, the soft magnetic layer 114, and the metal gate 118 localized to the semiconductor fin 102. In this manner, each of the gate dielectric layer 108, the hard layer 110, the tunnel barrier layer 112, and the soft layer 114 has a line-shaped cross-section. Afterwards, the gate spacers 120 are formed on sidewalls of the MTJ-containing gate structure 104 by depositing one or more spacer materials on the MTJ-containing gate structure 104, followed by etching the spacer materials using an anisotropic etching process as discussed previously with respect to FIG. 14.

In FIG. 20, epitaxial source/drain regions 106 are formed on the fin 102 and on opposite sides of the MTJ-containing gate structure 104. Details about forming the source/drain regions 106 are described previously with respect to FIG. 15, and thus they are not repeated for the sake of brevity.

In FIG. 21, a first ILD layer 111 is formed over the source/drain regions 106, and source/drain contacts 122 are formed in the first ILD layer 111 and over the respective source/drain regions 106. Then, a first interconnect level MLI1 is formed over the first ILD layer 111. Details about forming the first ILD layer 111, the source/drain contacts 122, and the first interconnect level MLI1 are described previously with respect to FIGS. 17 and 18, and thus they are not repeated for the sake of brevity.

FIGS. 22A-25C are top views and cross-sectional views of intermediate stages in the manufacturing of an IC structure having MeFET memory devices using a gate-first process flow, in accordance with some embodiments of the present disclosure. It is understood that additional operations can be provided before, during, and after processes shown by FIGS. 22A-25C, and some of the operations described below can be replaced or eliminated, for additional embodiments of the method. The order of the operations/processes may be interchangeable. In FIGS. 22A-25C, the "A" figures (e.g., FIG. 22A) each illustrate a top view of the IC structure, the "B" figures (e.g., FIG. 22B) each illustrate a cross-sectional view obtained from a plane containing A-A' line, and the "C" figures (e.g., FIG. 22C) each illustrate a cross-sectional view obtained from a plane containing B-B' line.

Figure 22C:
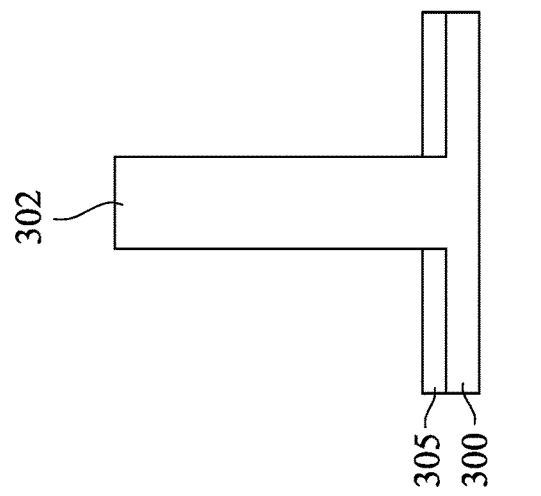
FIGS. 22A-25C are top views and cross-sectional views of intermediate stages in the manufacturing of an IC structure having MeFET memory devices using a gate-first process flow, in accordance with some embodiments of the present disclosure.
Figure 22B:
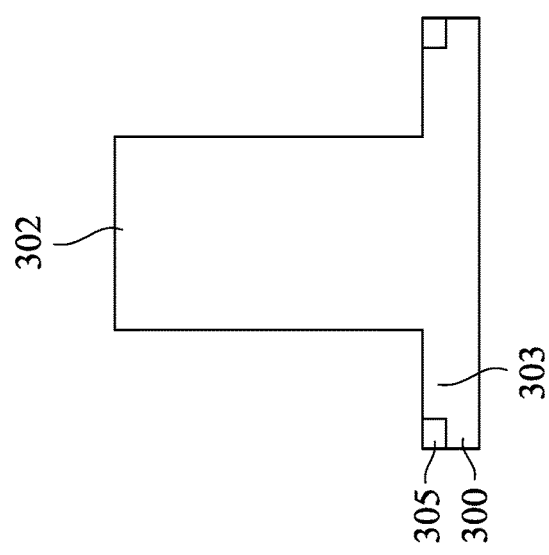
Figure 22A:
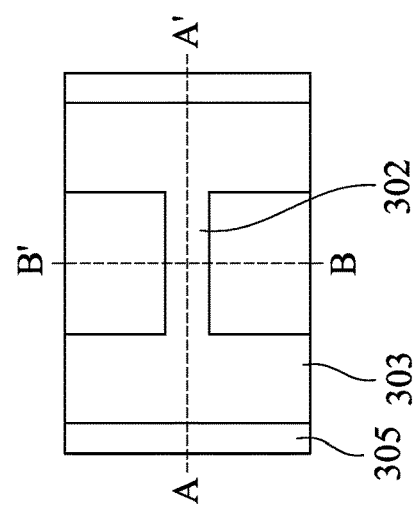

In FIGS. 22A-22C, a semiconductor fin 302 is formed on a pedestal region 303 of a semiconductor substrate 300. In some embodiments, the semiconductor fin 302 and the pedestal region 303 can be formed by, for example, performing multiple patterning steps on the semiconductor substrate 300. By way of example and not limitation, a first patterned mask with an H-shaped top-view profile is formed over the substrate 300, and then a first etching step is performed on the substrate 300 using the first patterned mask as an etch mask to form a pedestal region 303 having the H-shaped top-view profile, then a second patterned mask with a strip-shaped top-view profile is formed over a central region of the pedestal region 303, and then a second etching step is performed on the pedestal region 303 using the second patterned mask as an etch mask to form the semiconductor fin 302 having the strip-shaped top-view profile. Thereafter, STI regions 305 are formed over the substrate 300. In some embodiments, formation of the STI regions 305 includes, for example, depositing one or more dielectric materials over the substrate 300, performing an CMP process on the deposited dielectric material until the semiconductor fin 302 gets exposed, and then etching back to dielectric material until the pedestal region 303 gets exposed.

Figure 23C:
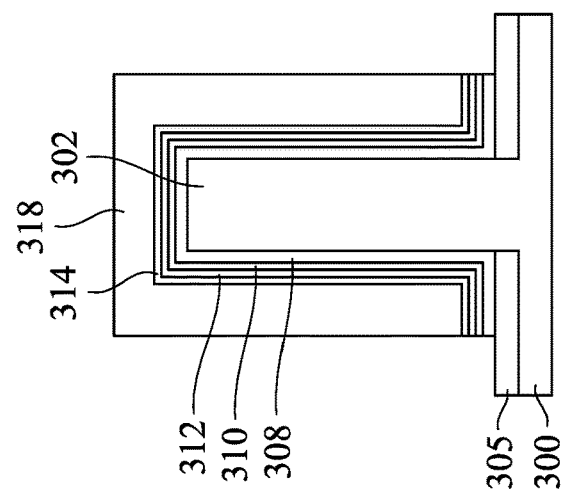
Figure 23B:
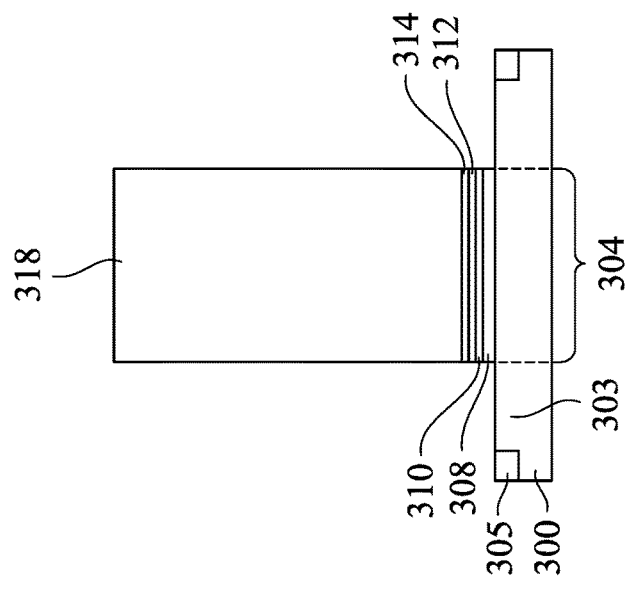
Figure 23A:
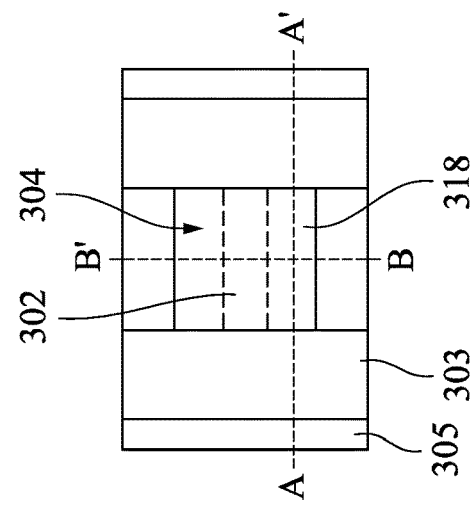

In FIGS. 23A-23C, an MTJ-containing gate structure 304 is formed over a portion of the pedestal region 303 and across the semiconductor fin 302. The gate structure will remain in a final MeFET-based memory device, not being replaced with another gate structure in subsequent processing. Specifically, materials of the MTJ-containing gate structure 304 are deposited in sequence over the substrate 100, followed by an etching process to pattern these materials into a gate dielectric layer 308, a hard magnetic layer 310, a tunnel barrier layer 312, a soft magnetic layer 314, and a metal gate 318. The hard magnetic layer 310, the tunnel barrier layer 312, and the soft magnetic layer 314 collectively serve as an MTJ stack. Materials of the gate dielectric layer 308, the hard layer 310, the tunnel barrier layer 312, and the soft layer 314 are similar to that of the gate dielectric layer 108, the hard magnetic layer 110, the tunnel barrier layer 112, the soft magnetic layer 114, and the metal gate 118, and thus they are not repeated for the sake of brevity. In the top view of FIG. 23A, the dash line shows the semiconductor fin 302 covered by the MTJ-containing gate structure 304.

Figure 24C:
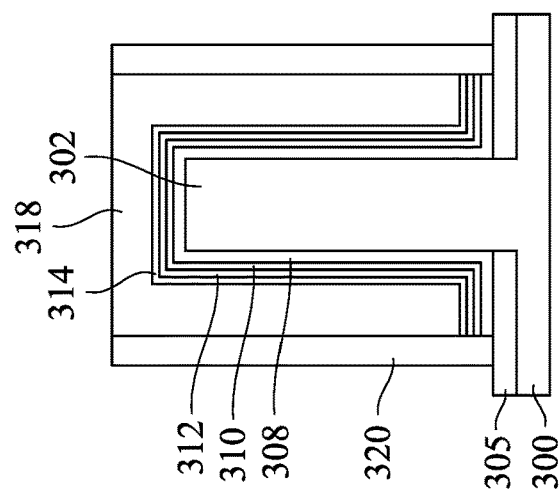
Figure 24B:
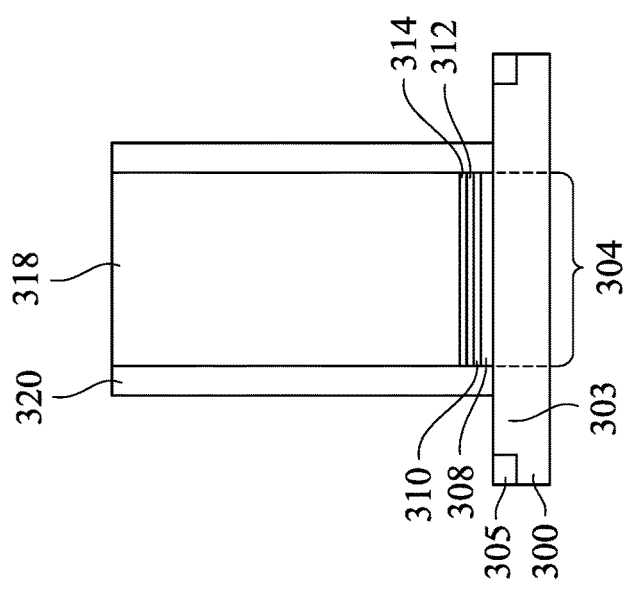
Figure 24A:
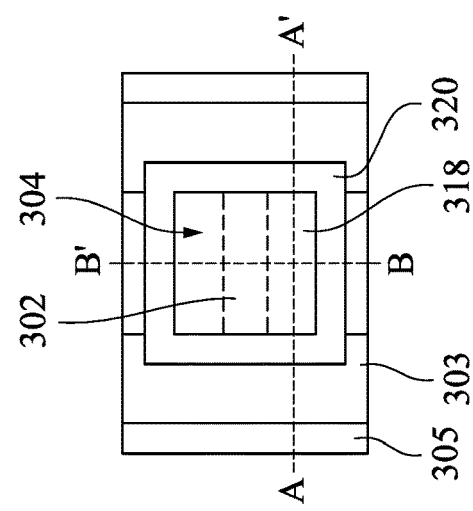

In FIGS. 24A-24C, gate spacers 320 are formed on sidewalls of the MTJ-containing gate structure 104. Formation of the gate spacers 320 includes, for example, depositing one or more spacer materials on the MTJ-containing gate structure 304, followed by etching the spacer materials using an anisotropic etching process as discussed previously with respect to FIG. 14. In some embodiments, as illustrated in the top view of FIG. 24A, four gate spacers 320 are respectively formed on four sides of the MTJ-containing gate structure 304. These gate spacers 320 are connected as a rectangular or square ring-shaped spacer that encloses the MTJ-containing gate structure 304.

Figure 25C:
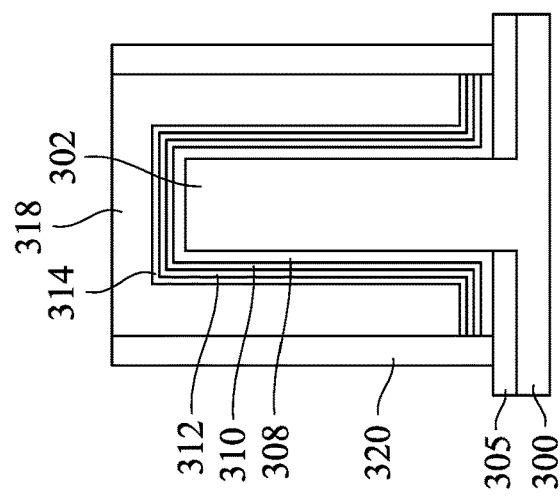
Figure 25B:
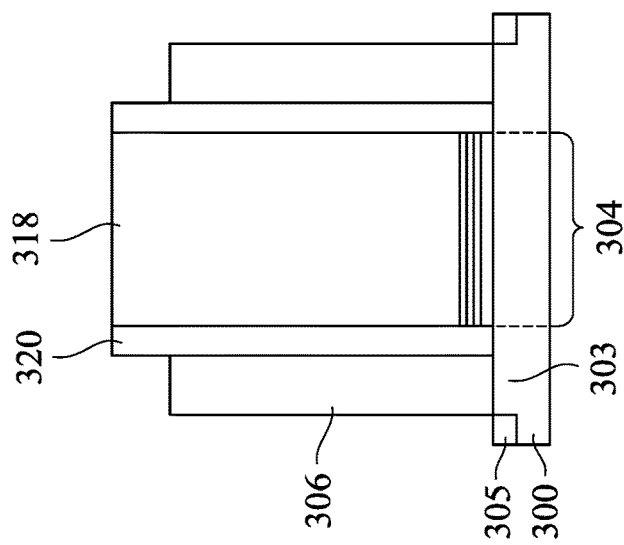
Figure 25A:
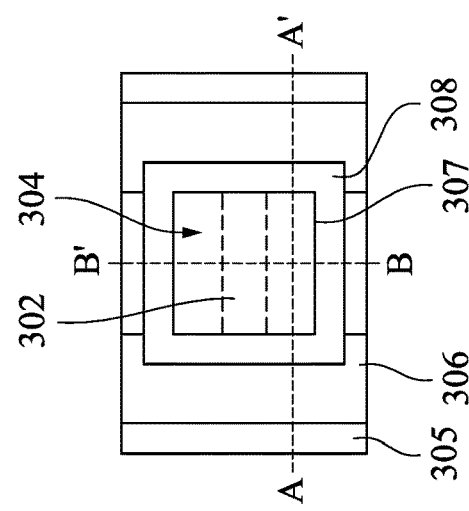

In FIGS. 25A-25C, epitaxial source/drain regions 306 are formed on the exposed surface of the pedestal region 303 of the semiconductor substrate 300 by using, for example, selective epitaxial growth (SEG) to selectively deposit a crystalline semiconductor material on the exposed surface of the pedestal region 303. Details of forming the source/drain regions 306 are similar to that of the source/drain regions 106 described previously with respect to FIG. 15, and thus they are not repeated for the sake of brevity. In some embodiments, the epitaxial source/drain regions 306 has a thickness in a range from about 1 nm to about 100 nm. Afterwards, BEOL processes are performed to form interconnect structures (e.g., metal vias and metal lines as illustrated in FIG. 21) over the structure as shown in FIGS. 25A-25C.

FIGS. 26A-29C are top views and cross-sectional views of intermediate stages in the manufacturing of an IC structure having MeFET memory devices using a gate-last process flow, in accordance with some embodiments of the present disclosure. It is understood that additional operations can be provided before, during, and after processes shown by FIGS. 26A-29C, and some of the operations described below can be replaced or eliminated, for additional embodiments of the method. The order of the operations/processes may be interchangeable. In FIGS. 26A-29C, the "A" figures (e.g., FIG. 26A) each illustrate a top view of the IC structure, the "B" figures (e.g., FIG. 26B) each illustrate a cross-sectional view obtained from a plane containing A-A' line, and the "C" figures (e.g., FIG. 26C) each illustrate a cross-sectional view obtained from a plane containing B-B' line.

Figure 26C:
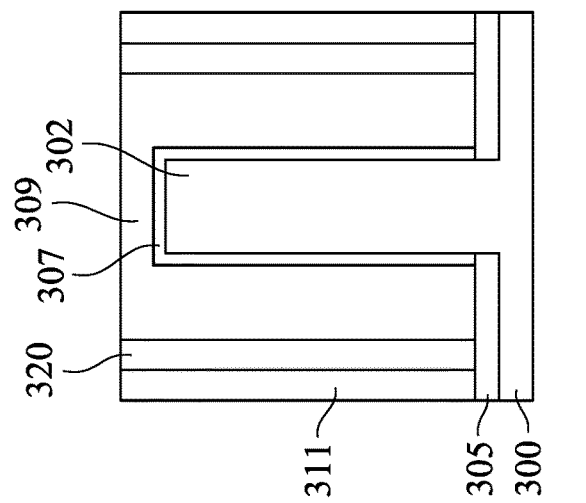
Figure 26B:
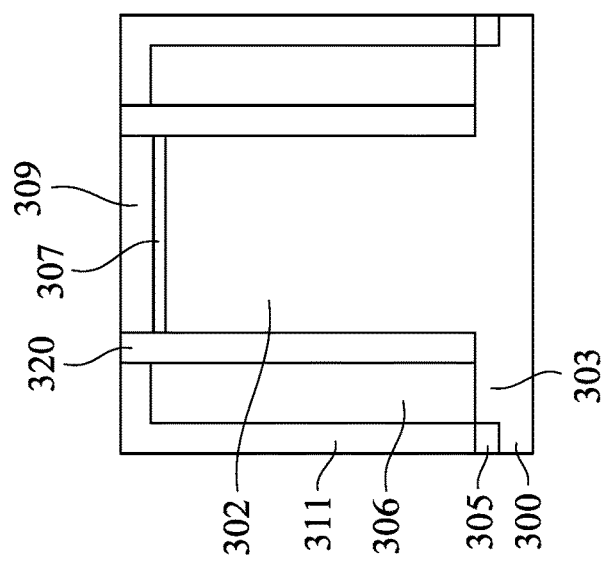
Figure 26A:
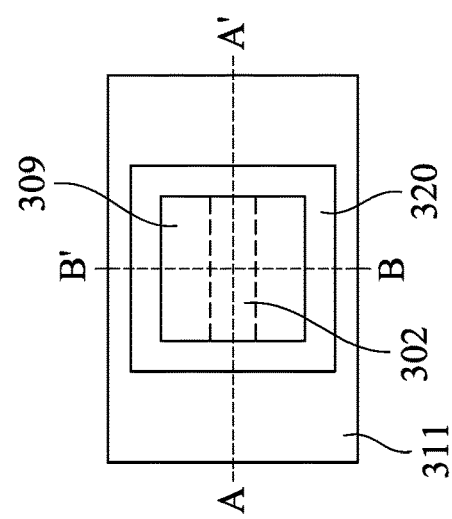

In FIGS. 26A-26C, after formation of the semiconductor fin 302, the pedestal region 303 and STI regions 305 (the step as shown in FIGS. 22A-22C) is complete, a dummy gate dielectric layer 307 is formed across the semiconductor fin 302, and a dummy gate structure 309 is then formed over the dummy gate dielectric layer 307. Materials and example processes for forming the dummy gate dielectric layer 307 and dummy gate structure 309 are similar to that of the dummy gate dielectric layer 107 and dummy gate structure 109 as discussed previously with respect to FIG. 14, and thus they are not repeated for the sake of brevity.

Thereafter, gate spacers 320 are formed on sidewalls of the dummy gate structure 309. In some embodiments, as illustrated in the top view of FIG. 26A, four gate spacers 320 are respectively formed on four sides of the dummy gate structure 309. These gate spacers 320 are connected as a rectangular or square ring-shaped spacer that encloses the dummy gate structure 309. Afterwards, epitaxial source/drain regions 306 are formed on the exposed surface of the pedestal region 303 of the semiconductor substrate 300 by using, for example, selective epitaxial growth (SEG) to selectively deposit a crystalline semiconductor material on the exposed surface of the pedestal region 303. Then, an ILD layer (e.g., SiO$_2$, low-k dielectrics, or the like) 311 is formed over the epitaxial source/drain regions 306, by depositing one or more dielectric materials over the epitaxial source/drain regions 306 and the dummy gate structure 309 and performing a CMP process until the dummy gate structure 309 is exposed.

Figure 27C:
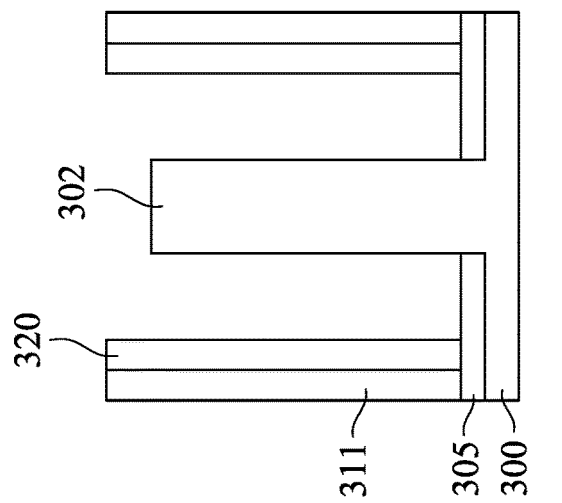
Figure 27B:
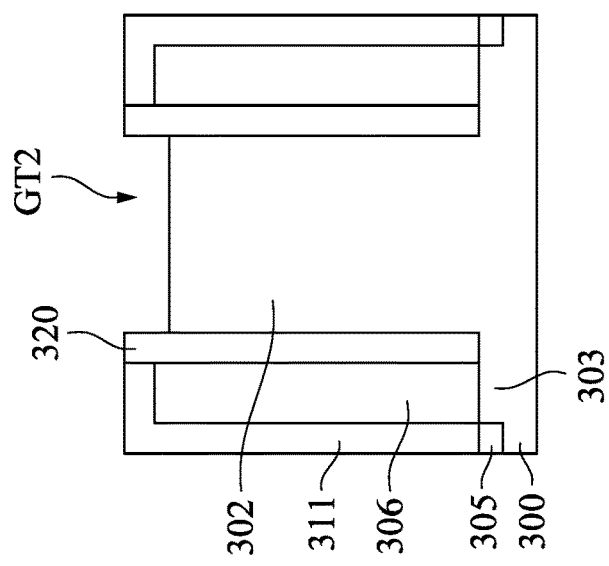
Figure 27A:
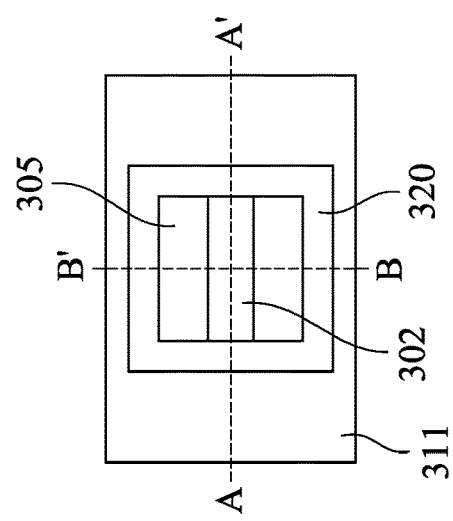
Figure 28C:
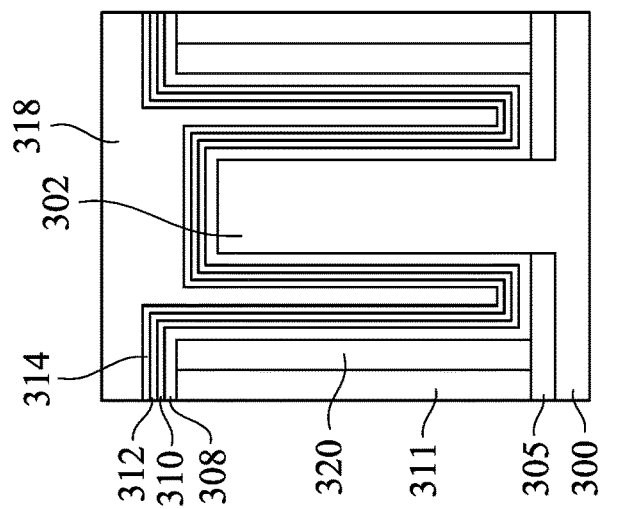
Figure 28B:
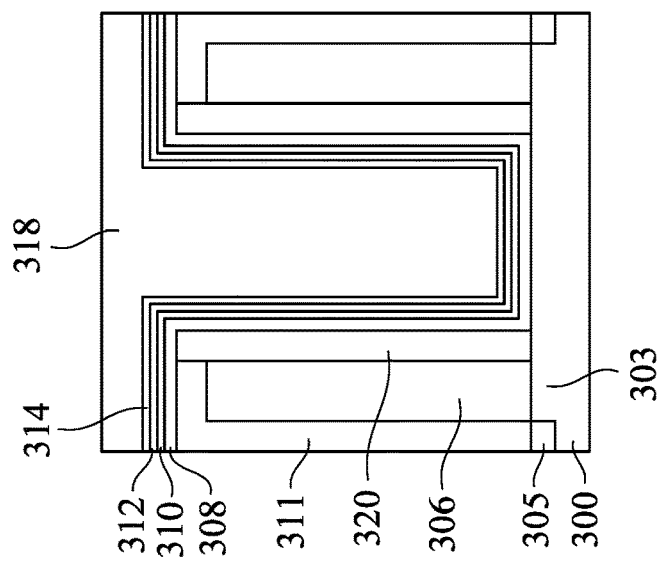
Figure 28A:
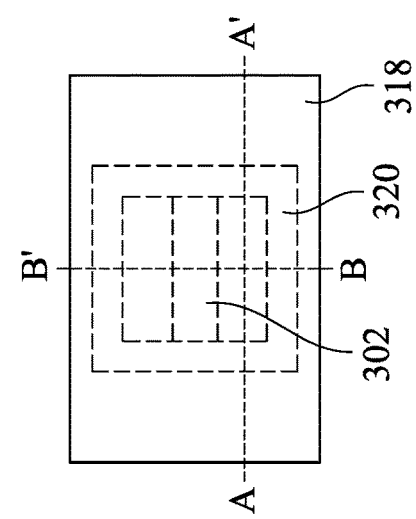

In FIGS. 27A-27C, the dummy gate structure 309 and the dummy gate dielectric layer 307 are removed, thereby forming a gate trench GT2 between gate spacers 320. Next, in FIGS. 28A-28C, a gate dielectric layer 308, a hard magnetic layer 310, a tunnel barrier layer 312, a soft magnetic layer 314, and a metal gate 318 are deposited in sequence until the gate trench GT2 are overfilled. In FIGS. 29A-29C, a CMP process is performed to remove excess materials of the gate dielectric layer 308, the hard magnetic layer 310, the tunnel barrier layer 312, the soft magnetic layer 314, and the metal gate 318 outside the gate trench GT2. In this way, remaining portions of the gate dielectric layer 308, the hard magnetic layer 310, the tunnel barrier layer 312, the soft magnetic layer 314, and the metal gate 318 in the gate trench GT2 can be collectively referred to as an MTJ-containing gate structure 304. Afterwards, BEOL processes are performed to form interconnect structures (e.g., metal vias and metal lines as illustrated in FIG. 21) over the structure as shown in FIGS. 29A-29C.

FIGS. 30A-35C are top views and cross-sectional views of intermediate stages in the manufacturing of an IC structure having MeFET memory devices in a form of gate-all-around (GAA) devices, in accordance with some embodiments of the present disclosure. It is understood that additional operations can be provided before, during, and after processes shown by FIGS. 30A-35C, and some of the operations described below can be replaced or eliminated, for additional embodiments of the method. The order of the operations/processes may be interchangeable. In FIGS. 30A-35C, the "A" figures (e.g., FIG. 30A) each illustrate a top view of the IC structure, the "B" figures (e.g., FIG. 30B)

each illustrate a cross-sectional view obtained from a plane containing A-A' line, and the "C" figures (e.g., FIG. 30C) each illustrate a cross-sectional view obtained from a plane containing B-B' line.

Figure 30C:
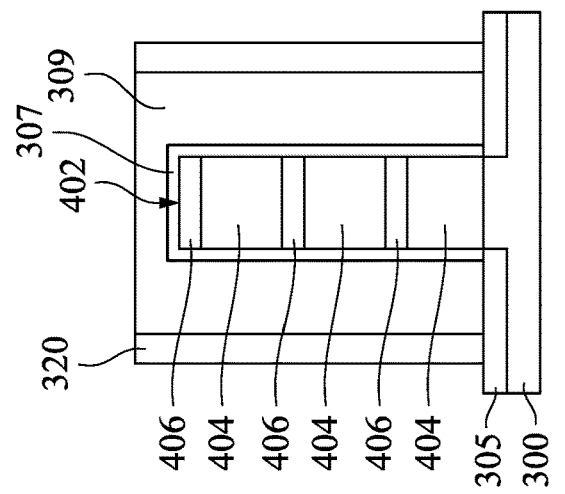
Figure 30B:
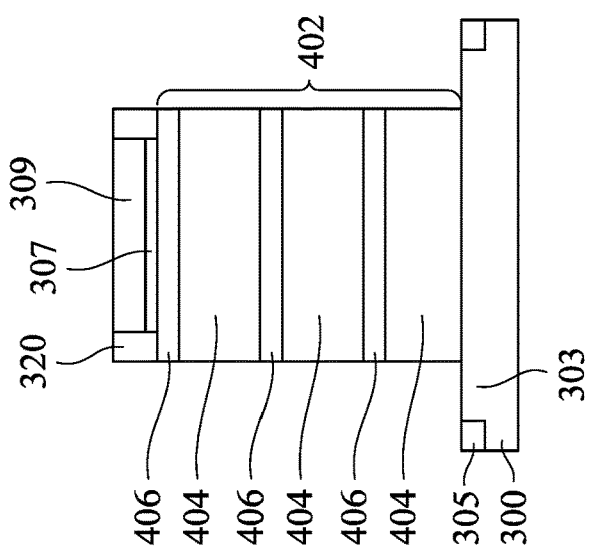
Figure 30A:
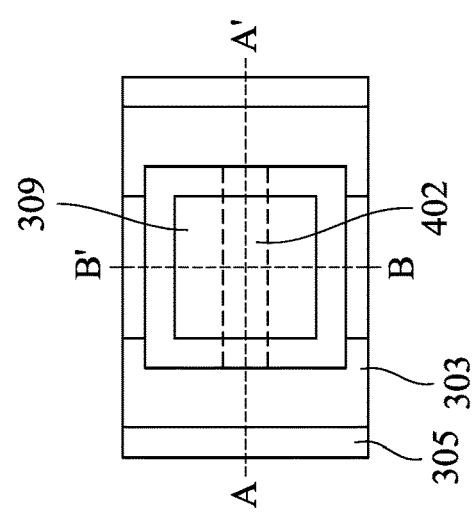

In FIGS. 30A-30C, an epitaxial stack 402 is formed over the pedestal region 303 of the substrate 300. The epitaxial stack 402 includes epitaxial layers 404 of a first composition interposed by epitaxial layers 406 of a second composition. The first and second compositions can be different. In some embodiments, the epitaxial layers 404 are SiGe and the epitaxial layers 406 are silicon (Si). However, other embodiments are possible including those that provide for a first composition and a second composition having different oxidation rates and/or etch selectivity. In some embodiments, the epitaxial layers 404 include SiGe and where the epitaxial layers 406 include Si, the Si oxidation rate of the epitaxial layers 406 is less than the SiGe oxidation rate of the epitaxial layers 404.

It is noted that three layers of the epitaxial layers 404 and three layers of the epitaxial layers 406 are alternately arranged as illustrated in FIGS. 30B-30C, which is for illustrative purposes only and not intended to be limiting beyond what is specifically recited in the claims. It can be appreciated that any number of epitaxial layers can be formed in the epitaxial stack 402; the number of layers depending on the desired number of channels regions for the transistor. In some embodiments, the number of epitaxial layers 406 is between 2 and 10.

As described in more detail below, the epitaxial layers 406 will serve as transistor channel regions for a subsequently-formed GAA device and the thickness is chosen based on device performance considerations. The epitaxial layers 404 may eventually be removed and serve to define a vertical distance between adjacent channel region(s) for a subsequently-formed multi-gate device and the thickness is chosen based on device performance considerations. Accordingly, the epitaxial layers 404 may also be referred to as sacrificial layers, and epitaxial layers 406 may also be referred to as channel layers.

By way of example, epitaxial growth of the layers of the stack 402 may be performed by a molecular beam epitaxy (MBE) process, a metalorganic chemical vapor deposition (MOCVD) process, and/or other suitable epitaxial growth processes. In some embodiments, the epitaxially grown layers, such as the epitaxial layers 406, include the same material as the substrate 300. In some embodiments, the epitaxially grown layers 404 and 406 include a different material than the substrate 300. As stated above, in at least some examples, the epitaxial layers 404 include an epitaxially grown silicon germanium (SiGe) layer and the epitaxial layers 406 include an epitaxially grown silicon (Si) layer. Alternatively, in some embodiments, either of the epitaxial layers 404 and 406 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 404 and 406 may be chosen based on providing differing oxidation and/or etching selectivity properties. In some embodiments, the epitaxial layers 404 and 406 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

A dummy gate dielectric layer 307 is formed over the epitaxial stack 402, and a dummy gate structure 309 is formed over the dummy gate dielectric layer 307. Gate spacers 320 are formed on sidewalls of the dummy gate structure 309, and then exposed portions of the epitaxial stack 402 laterally extending beyond the dummy gate structure 309 and gate spacers 320 are etched until the pedestal region 303 is exposed. Materials and example processes for forming the dummy gate dielectric layer 307, dummy gate structure 309 and gate spacers 320 are similar to that of the dummy gate dielectric layer 107, dummy gate structure 109 and gate spacers 120 as discussed previously with respect to FIG. 14, and thus they are not repeated for the sake of brevity.

In FIGS. 31A-31C, the sacrificial layers 404 are laterally or horizontally recessed by using suitable etch techniques, resulting in lateral recesses each vertically between corresponding channel layers 406. This step may be performed by using a selective etching process. By way of example and not limitation, the sacrificial layers 404 are SiGe and the channel layers 406 are silicon allowing for the selective etching of the sacrificial layers 404. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is slower than oxidation rate of SiGe, the channel layers 406 is not significantly etched by the process of laterally recessing the sacrificial layers 404. As a result, the channel layers 406 laterally extend past opposite end surfaces of the sacrificial layers 404.

After laterally recessing the sacrificial layers 404, inner spacers 408 are formed to fill the recesses left by the lateral etching of the sacrificial layers 404. The inner spacers 408 may be formed by, for example, depositing one or more dielectric materials in the recesses left by the lateral etching of the sacrificial layers 404, followed by performing an anisotropic etching process to trim the deposited one or more dielectric materials. After the trimming process, the remaining portions of the deposited one or more dielectric materials are denoted as inner spacers 408. The inner spacers 408 serve to isolate the MTJ-containing gate from source/drain epitaxial structures formed in subsequent processing. In the example as illustrated in FIG. 31B, outermost sidewalls of the inner spacers 408 are substantially aligned with sidewalls of the channel layers 406.

Figures 32A, 32B, 32C:
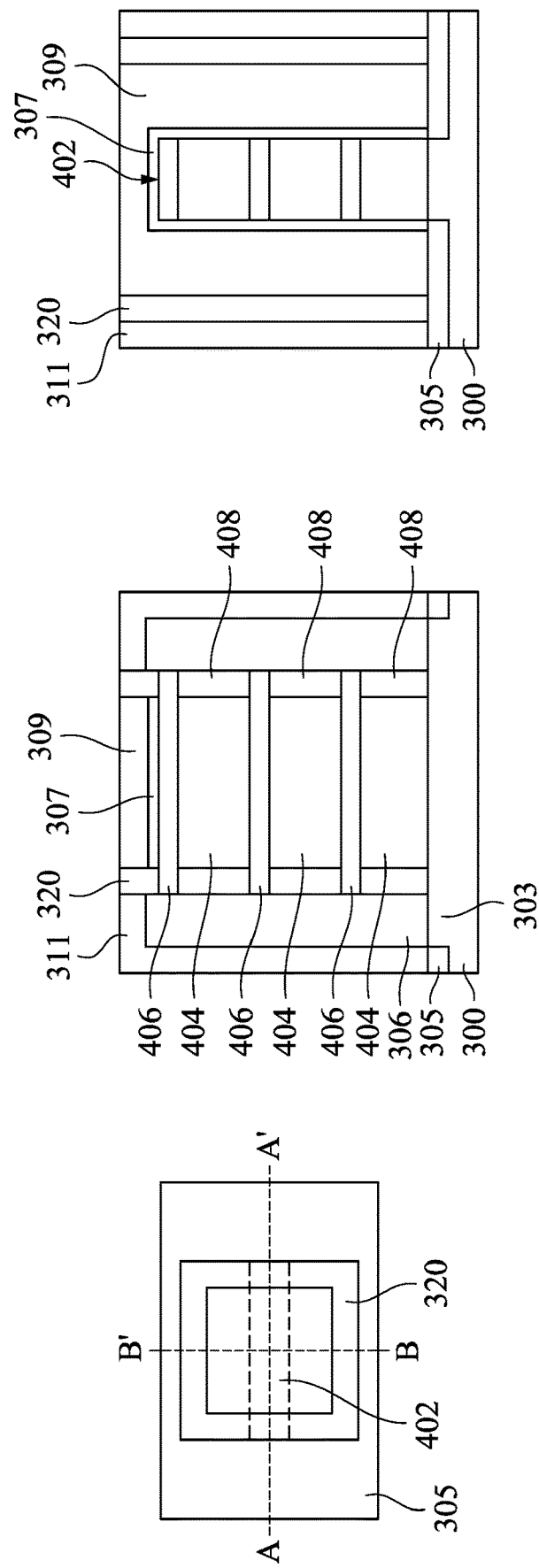

In FIGS. 32A-32C, epitaxial source/drain regions 306 are formed on the exposed surface of the pedestal region 303 of the semiconductor substrate 300 by using, for example, selective epitaxial growth (SEG) to selectively deposit a crystalline semiconductor material on the exposed surface of the pedestal region 303. Details of forming the source/drain regions 306 are similar to that of the source/drain regions 106 described previously with respect to FIG. 15, and thus they are not repeated for the sake of brevity. Then, an ILD layer 311 is formed over the epitaxial source/drain regions 306, by depositing one or more dielectric materials over the epitaxial source/drain regions 306 and the dummy gate structure 309 and performing a CMP process until the dummy gate structure 309 is exposed.

Figures 33A, 33B, 33C:
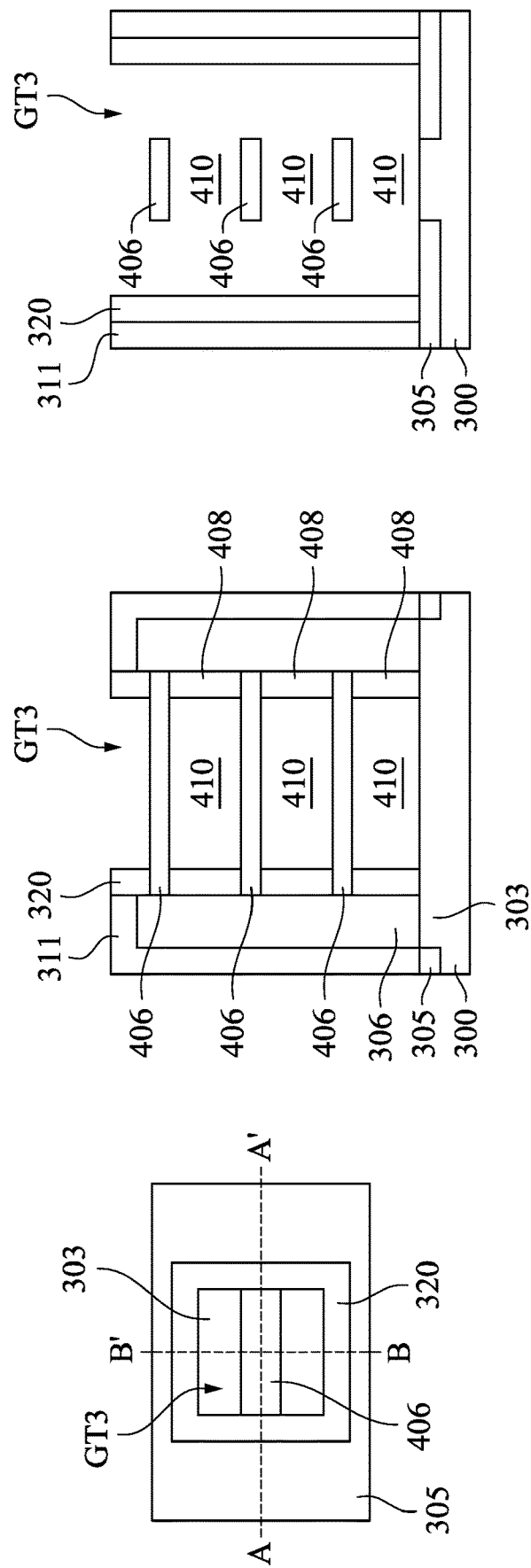

In FIGS. 33A-33C, the dummy gate structure 309 and the dummy gate dielectric layer 307 are removed, and then the sacrificial layers 404 are removed. In some embodiments, the dummy gate structure 309 and the dummy gate dielectric layer 307 are removed by using one or more selective etching processes (e.g., selective dry etching, selective wet etching, combinations thereof) that etch the materials in dummy gate structure 309 and the dummy gate dielectric layer 307 at a faster etch rate than etching other materials (e.g., gate spacers 320, inner spacers 408 and/or ILD layer 311), thus resulting in a gate trench GT3 between corresponding gate spacers 320, with the sacrificial layers 404 exposed in the gate trenches GT3. Subsequently, the sacrificial layers 404 in the gate trenches GT3 are removed by using another selective etching process that etches the sacrificial layers 404 at a faster etch rate than etching the channel layers 406, thus forming openings 410 between neighboring channel layers 406. In this way, the channel layers 406 become nanosheets suspended over the substrate 300 and between the source/drain epitaxial structures 306. This step is also called a channel release process. At this interim processing step, the openings 410 between nanosheets 406 may be filled with ambient environment conditions (e.g., air, nitrogen, etc). In some embodiments, the nanosheets 406 can be interchangeably referred to as nanowires, nanoslabs and nanorings, depending on their geometry. For example, in some other embodiments the channel layers 406 may be trimmed to have a substantial rounded shape (i.e., cylindrical) due to the selective etching process for completely removing the sacrificial layers 404. In that case, the resultant channel layers 406 can be called nanowires. In some embodiments, geometry of the channel layers 406 may be circular, diamond, or the like, and the channel layers 406 may have rounded corners. In some embodiments, the channel layers 406 each has a thickness in a range from about 1 nm to about 100 nm, a width in a range from about 1 nm to about 100 nm, and a number of the channel layer 406 may be one or more. In some embodiments, the vertical pitch of the channel layers 406 may be in a range from about 2 nm to about 500 nm.

In some embodiments, the sacrificial layers 404 are removed by using a selective wet etching process. In some embodiments, the sacrificial layers 404 are SiGe and the channel layers 406 are silicon allowing for the selective removal of the sacrificial layers 404. In some embodiments, the selective wet etching includes an APM etch (e.g., ammonia hydroxide-hydrogen peroxide-water mixture). In some embodiments, the selective removal includes SiGe oxidation followed by a SiGeO$_x$ removal. For example, the oxidation may be provided by O$_3$ clean and then SiGeO$_x$ removed by an etchant such as NH$_4$OH that selectively etches SiGeO$_x$ at a faster etch rate than it etches Si. Moreover, because oxidation rate of Si is much slower (sometimes 30 times slower) than oxidation rate of SiGe, the channel layers 406 may not be significantly etched by the channel release process.

Figures 34A, 34B, 34C:
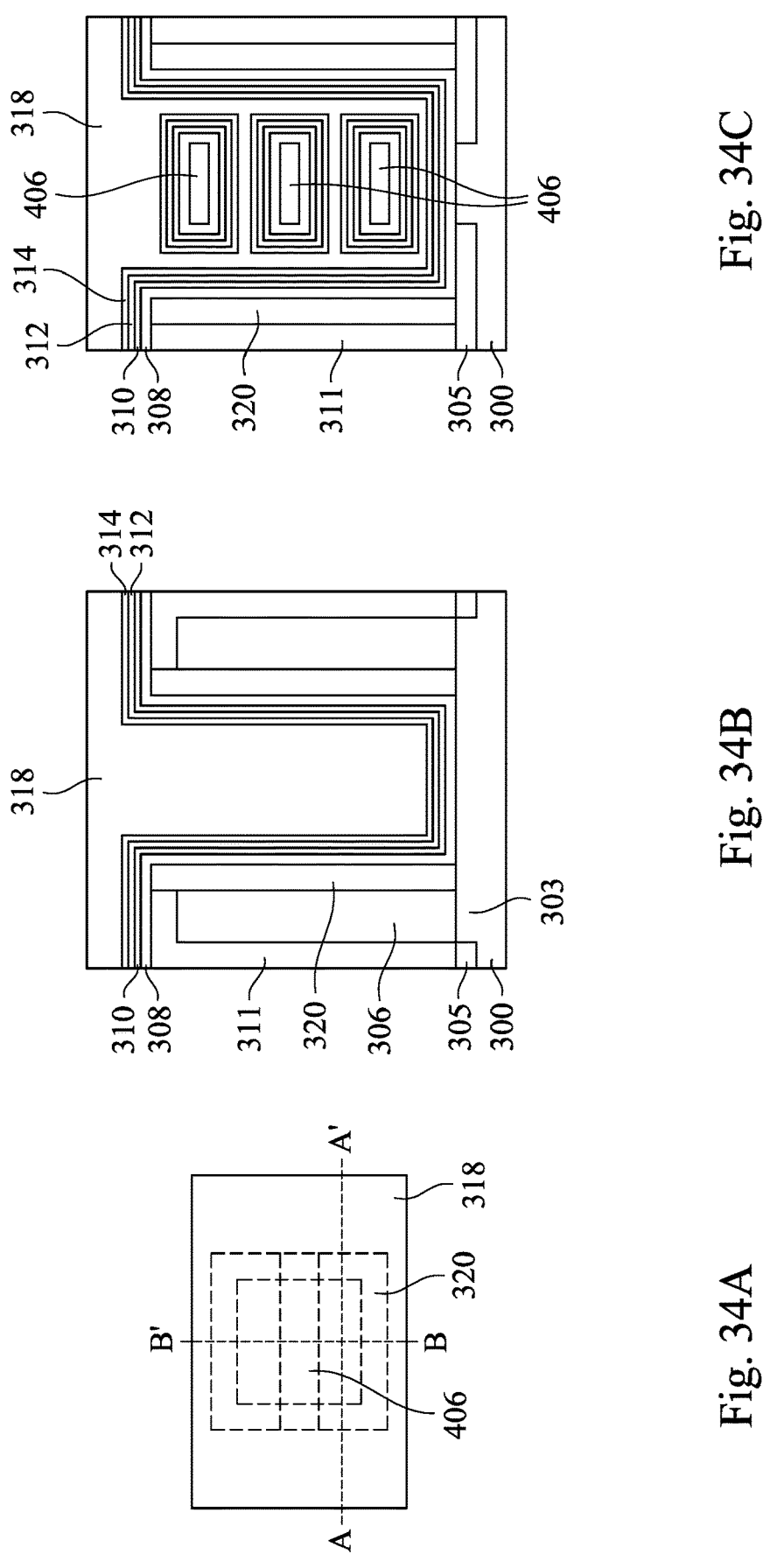

Next, in FIGS. 34A-34C, a gate dielectric layer 308, a hard magnetic layer 310, a tunnel barrier layer 312, a soft magnetic layer 314, and a metal gate 318 are deposited in sequence until the gate trench GT3 are overfilled. In FIGS. 35A-35C, a CMP process is performed to remove excess materials of the gate dielectric layer 308, the hard magnetic layer 310, the tunnel barrier layer 312, the soft magnetic layer 314, and the metal gate 318 outside the gate trench GT3. In this way, remaining portions of the gate dielectric layer 308, the hard magnetic layer 310, the tunnel barrier layer 312, the soft magnetic layer 314, and the metal gate 318 in the gate trench GT3 can be collectively referred to as an MTJ-containing gate structure 304. Afterwards, BEOL processes are performed to form interconnect structures (e.g., metal vias and metal lines as illustrated in FIG. 21) over the structure as shown in FIGS. 35A-35C.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that the MeFET-based memory device can be operated using VCMA or a magnetic field without a current tunneling through the tunnel barrier layer in the MTJ, and thus the MeFET-based memory device has an improve tunnel barrier reliability and a reduced power consumption. Another advantage is that the MTJ is integrated in transistors fabricated in FEOL processing, and thus the BEOL processing can be performed with more available routing space for interconnect lines and vias.

In some embodiments, a memory device comprises a source region, a drain region, a channel region, a gate dielectric layer, an MTJ stack, and a metal gate. The source region and the drain region are over a substrate. The channel region is between the source region and the drain region. The gate dielectric layer is over the channel region. The MTJ stack is over the gate dielectric layer. The MTJ stack comprises a first ferromagnetic layer, a second ferromagnetic layer with a switchable magnetization, and a tunnel barrier layer between the first and second ferromagnetic layers. The metal gate is over the MTJ stack. In some embodiments, the tunnel barrier layer has a thickness greater than a thickness of the second ferromagnetic layer. In some embodiments, the second ferromagnetic layer is in contact with the metal gate. In some embodiments, the first ferromagnetic layer is in contact with the gate dielectric layer. In some embodiments, the first ferromagnetic layer has an U-shaped cross-section, the tunnel barrier layer has an U-shaped cross-section, and the second ferromagnetic layer has an U-shaped cross-section. In some embodiments, a capacitance of the MTJ stack is less than a capacitance of the gate dielectric layer.

In some embodiments, a memory device comprises an MTJ structure, a source region, a drain region, and a gate. The MTJ structure is over a semiconductor channel region. The source region and drain region are on opposite sides of the MTJ structure, respectively. The gate is over the MTJ structure. A capacitance of the MTJ structure has binary values switchable by a voltage applied to the gate. A drain current of the drain region is dependent on the capacitance of the MTJ structure. In some embodiments, the memory device further comprises gate dielectric layer spacing the MTJ structure apart from the semiconductor channel region. In some embodiments, one or both of the binary values of the capacitance of the MTJ structure are less than a capacitance of the gate dielectric layer. In some embodiments, the memory device further comprises a metal line laterally extending above the gate, and the capacitance of the MTJ structure is also switchable by a magnetic field generated from the metal line. In some embodiments, the drain current dependent on the capacitance of the MTJ structure is a drain saturation current or a subthreshold drain current.

In some embodiments, a method comprises forming a semiconductor channel over a substrate, forming source/drain regions on opposite sides of semiconductor channel, respectively, forming a gate dielectric layer on semiconductor channel, forming an MTJ stack over the gate dielectric layer, and forming a metal gate over the MTJ stack. The MTJ stack comprises a first ferromagnetic layer over the gate dielectric layer, a tunnel barrier layer over the first ferromagnetic layer, and a second ferromagnetic layer over the tunnel barrier layer. In some embodiments, the method further comprises forming a dummy gate structure over the semiconductor channel, forming gate spacers on sidewalls of the dummy gate structure, removing the dummy gate structure to form a gate trench between the gate spacers, wherein after removing the gate structure, the gate dielectric layer, the MTJ stack, and the metal gate are formed in the gate trench. In some embodiments, the gate dielectric layer, the MTJ stack, and the metal gate are formed prior to forming the source/drain regions. In some embodiments, forming the semiconductor channel comprises forming a fin extending from a substrate. In some embodiments, forming the semiconductor channel comprises forming a nanosheet extending between the source/drain regions and suspended above a substrate. In some embodiments, the tunnel barrier layer is thicker than the second ferromagnetic layer. In some embodiments, the method further comprises forming a gate via on the metal gate and spaced apart from the MTJ stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductor channel over a substrate;
   forming source/drain regions on opposite sides of the semiconductor channel, respectively;
   forming a gate dielectric layer on semiconductor channel;
   forming a magnetic tunnel junction (MTJ) stack over the gate dielectric layer, the MTJ stack comprising a first ferromagnetic layer over the gate dielectric layer, a tunnel barrier layer over the first ferromagnetic layer, and a second ferromagnetic layer over the tunnel barrier layer, wherein the tunnel barrier layer is thicker than the second ferromagnetic layer such that in a write operation of the MTJ stack, a capacitance of the MTJ stack is switched by controlling a voltage pulse duration of a gate voltage applied across the MTJ stack, with no current flowing through the MTJ stack in the write operation for writing the MTJ stack; and
   forming a metal gate over the MTJ stack.

2. The method of claim 1, further comprising:
   forming a dummy gate structure over the semiconductor channel;
   forming gate spacers on sidewalls of the dummy gate structure; and
   removing the dummy gate structure to form a gate trench between the gate spacers,
   wherein after removing the dummy gate structure, the gate dielectric layer, the MTJ stack, and the metal gate are formed in the gate trench.

3. The method of claim 1, wherein forming the semiconductor channel comprises forming a fin extending from the substrate.

4. The method of claim 1, further comprising:
   forming a gate via on the metal gate and spaced apart from the MTJ stack.

5. A method comprising:
   forming a source region and a drain region over a substrate;
   forming a gate dielectric layer over a channel region between the source region and the drain region;
   forming a magnetic tunnel junction (MTJ) stack over the gate dielectric layer, the MTJ stack comprising a first ferromagnetic layer, a second ferromagnetic layer with a switchable magnetization, and a tunnel barrier layer between the first and second ferromagnetic layers, wherein the tunnel barrier layer has a thickness greater than a thickness of the second ferromagnetic layer such that a write operation of the MTJ stack is performed by controlling a voltage pulse duration of a gate voltage applied across the MTJ stack with no current tunneling through the tunnel barrier layer in the write operation for writing the MTJ stack; and
   forming a metal gate over the MTJ stack.

6. The method of claim 5, wherein the second ferromagnetic layer is in contact with the metal gate.

7. The method of claim 5, wherein the first ferromagnetic layer is in contact with the gate dielectric layer.

8. The method of claim 5, the first ferromagnetic layer has an U-shaped cross-section.

9. The method of claim 5, wherein the tunnel barrier layer has an U-shaped cross-section.

10. The method of claim 5, wherein the second ferromagnetic layer has an U-shaped cross-section.

11. The method of claim 5, wherein a capacitance of the MTJ stack is less than a capacitance of the gate dielectric layer.

12. A method comprising:
    forming a magnetic tunnel junction (MTJ) structure over a semiconductor channel region;
    forming a source region and a drain region on opposite sides of the MTJ structure, respectively; and
    forming a gate over the MTJ structure, wherein in a write operation for writing the MTJ structure, a capacitance of the MTJ structure is switched by controlling a voltage pulse duration of a gate voltage applied across the MTJ structure without passing a current through the MTJ structure, and a drain current of the drain region is dependent on the capacitance of the MTJ structure.

13. The method of claim 12, further comprising:
    forming a gate dielectric layer spacing the MTJ structure apart from the semiconductor channel region.

14. The method of claim 13, wherein
    the capacitance of the MTJ structure is less than a capacitance of the gate dielectric layer.

15. The method of claim 12, further comprising:
    forming a metal line laterally extending above the gate, wherein the capacitance of the MTJ structure is also switchable by a magnetic field generated from the metal line.

16. The method of claim 12, wherein the drain current dependent on the capacitance of the MTJ structure is a drain saturation current or a subthreshold drain current.

17. The method of claim 12, wherein the semiconductor channel region is in a fin extending from a substrate.

18. The method of claim 17, wherein the MTJ structure wraps around three sides of the fin.

19. The method of claim 1, wherein the tunnel barrier layer is thicker than the first ferromagnetic layer.

20. The method of claim 5, wherein the tunnel barrier layer is the thickest layer in the MTJ stack.

* * * * *